United States Patent
Mimura et al.

(10) Patent No.: US 6,307,144 B1
(45) Date of Patent: Oct. 23, 2001

(54) SOLAR CELL MODULE, SOLAR CELL ARRAY AND SUNLIGHT POWER GENERATION APPARATUS

(75) Inventors: Toshihiko Mimura, Nara; Masahiro Mori, Souraku-gun; Yuji Inoue, Nara; Satoru Shiomi; Ayako Komori, both of Mishima; Yoshitaka Nagao, Souraku-gun; Makoto Sasaoka; Hidehisa Makita, both of Kyotanabe; Shigenori Itoyama, Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/431,255

(22) Filed: Nov. 1, 1999

(30) Foreign Application Priority Data

Oct. 30, 1998 (JP) .................................. 10-310119
Oct. 29, 1999 (JP) .................................. 11-308561

(51) Int. Cl.$^7$ .......................... H01L 31/05; H01L 31/042
(52) U.S. Cl. .......................... 136/244; 136/251; 136/246; 136/259; 136/293; 60/641.8; 323/906
(58) Field of Search ..................... 136/244, 251, 136/246, 259, 293; 257/431, 443; 126/595, 599; 60/641.8; 323/906

(56) References Cited

U.S. PATENT DOCUMENTS 4,223,214 * 9/1980 Dorian et al. ........................ 250/203.4
4,349,775 * 9/1982 Kwon et al. ......................... 320/101
5,040,455 * 8/1991 Doi et al. ................................ 454/75
5,688,337 * 11/1997 Mosher ................................ 136/244
5,707,459   1/1998 Itoyama et al. ....................... 136/251

FOREIGN PATENT DOCUMENTS 9-148614    6/1997  (JP) .
11-40838 *  2/1999  (JP) .

* cited by examiner

*Primary Examiner*—Alan Diamond
(74) *Attorney, Agent, or Firm*—Fitzpatrick, Cella, Harper & Scinto

(57) ABSTRACT

A solar cell module comprising one or more solar cells enclosed therein is characterized in that the solar cell module has a heat-sensitive circuit cut-off means or a heat-sensitive circuit cut-off means having a functionally divided structure comprising a heat-sensitive means and a circuit cut-off means, is disclosed. A solar cell array comprising a plurality of solar cell modules electrically connected with each other by means of an electric connection means is, characterized in that the solar cell array has a heat-sensitive circuit cut-off means or a heat-sensitive circuit cut-off means having a functionally divided structure comprising a heat-sensitive means and a circuit cut-off means, is also disclosed. A sunlight power generation apparatus comprises a solar cell array and at least an inverter.

52 Claims, 20 Drawing Sheets

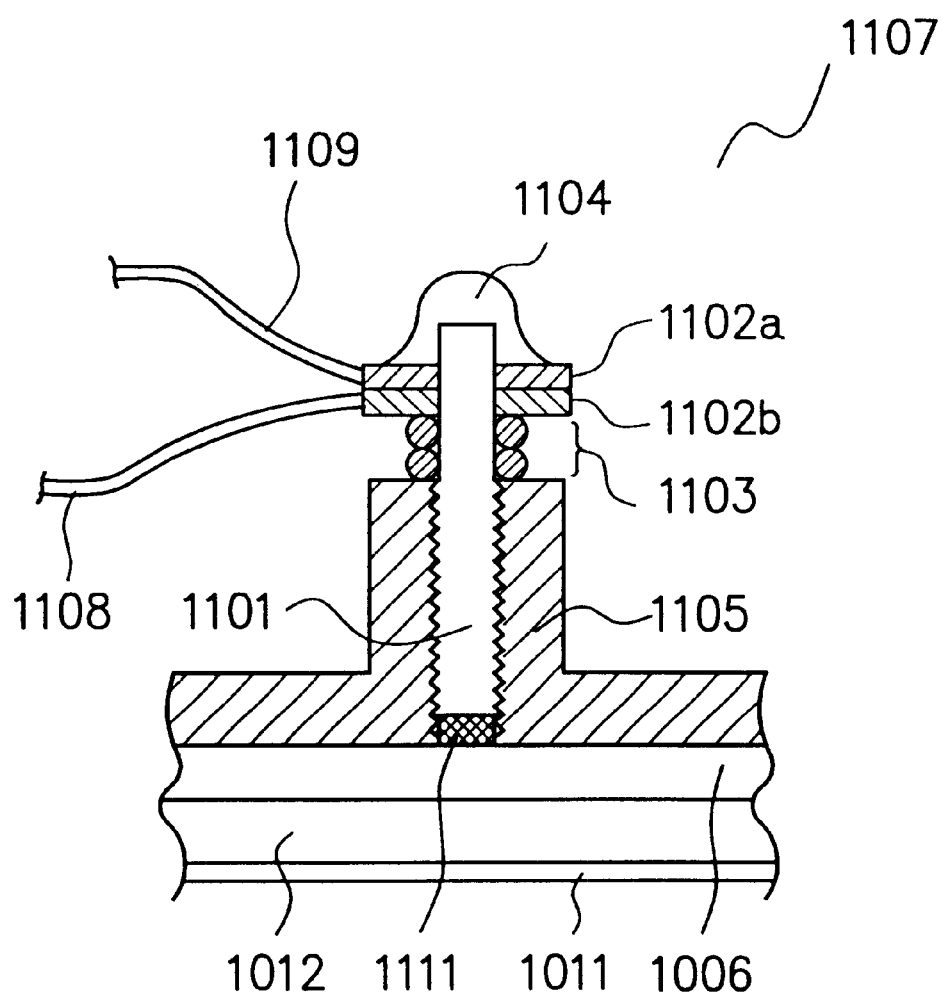
F I G. 11(B)

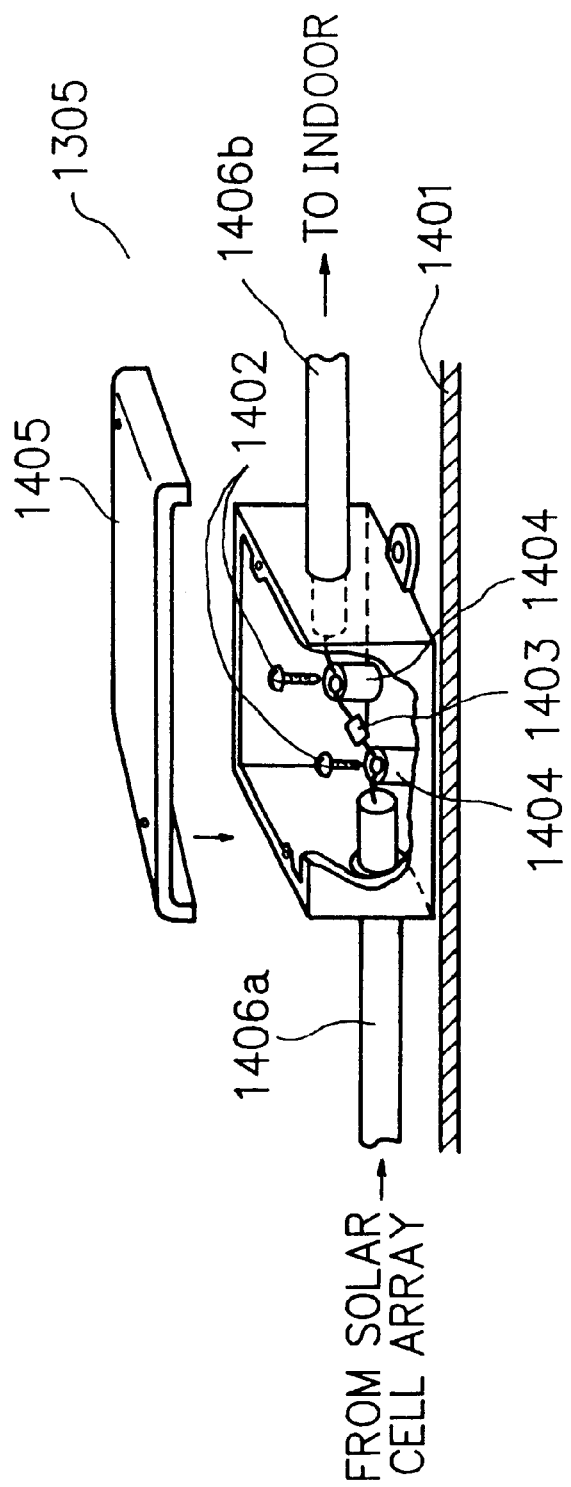

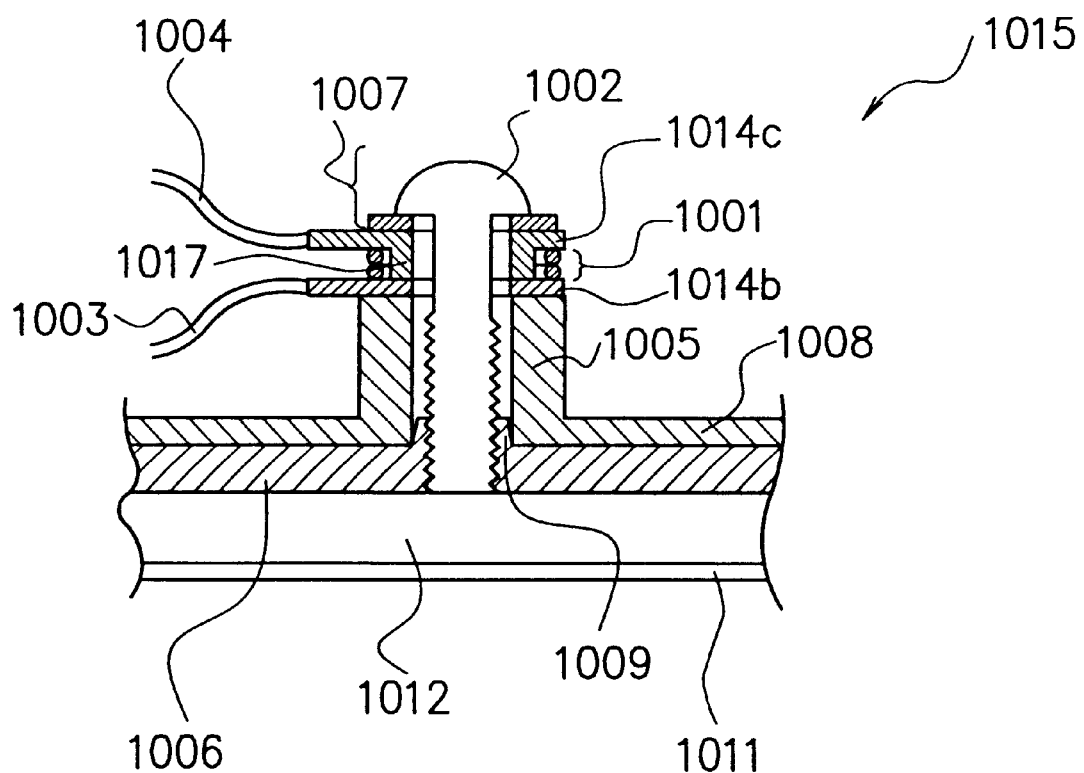
F I G. 15(B)

SOLAR CELL MODULE, SOLAR CELL ARRAY AND SUNLIGHT POWER GENERATION APPARATUS

BACKGROUND OF THE INVENTION

1. Field of the Invention

The present invention relates to a solar cell module having a specific heat-sensitive circuit cut-off means, a solar cell array comprising a plurality of solar cell module strings having a specific heat-sensitive circuit cut-off means arranged while being electrically connected with each other in parallel, and a sunlight power generation apparatus comprising said solar cell array. The term "solar cell module" in the present invention means a structural body comprising a plurality of solar cells (photovoltaic elements) electrically connected with each other in series while being sealed by means of a sealing material including an organic sealing resin. The term "solar cell module string" means a string comprising a plurality of solar cell modules arranged while being electrically connected with each other in series.

2. Related Background Art

In recent years, there have been proposed various solar cell modules having a configuration capable of being used as a building material such as so-called roof-integral type solar cell modules. These solar cell modules have been widely put to practical use by installion on a roof or the like of a building. Along with this, certain safty issues upon the occurrence of a fire have arisen for the following reason. The solar cell module comprises a plurality of solar cells (photovoltaic elements) electrically serialized while being sealed by means of a sealing material including an organic sealing resin, where the solar cells comprise inorganic materials which are incombustible, but the organic sealing resin is combustible. Thus, the solar cell module unavoidably contains a combustible material therein. In this connection, for instance, in the case where a plurality of solar cell modules are installed on a roof of a building, the roof is not constituted by incombustible materials only but instead includes also combustible materials based on the solar cell modules. Therefore, for the solar cell module, it is imperative to discuss fire safety.

There has been proposed a solar cell module having a surface covering material comprising an incombustible inorganic material such as glass or the like. This solar cell module is still insufficient in terms of incombustibility. For instance, Japanese Unexamined Patent Publication No. 148614/1997 discloses a solar cell module whose front side is protected by a tempered glass and which has a porous and incombustible absorber supported by a support at the back side. In this document, there is described that this solar cell module has advantages in that when the tempered glass as the front side protective member is broken by radiated heat or flame when a fire is occurs, the broken tempered glass is prevented from being scattered by means of the absorber and the support, and when the filler material of the solar cell module is heat-fused at that time, the fused material is absorbed by the absorber, whereby the fused material is prevented from flowing to the outside to cause firing. Hence, it is understood that the solar cell described in this document is still insufficient in terms of safety upon the occurrence of a fire.

For the solar cell module, in order to ensure the fire safety, besides making the solar cell module incombustible, there are also other subjects to be discussed as described below.

In the case where the solar cell module is used as a power generation source, it takes such a manner as will be described in the following in many cases. That is, a predetermined number of solar cell modules are electrically connected with each other by means of wiring cables to establish a solar cell array, and the solar cell array is electrically connected to an inverter.

For this solar cell array, there is an occasion such that, for instance, when a fire is occurs in the vicinity thereof, the coating of one or more of the wiring cables is broken by heat radiated from the fire to cause leakage or the coatings of the wiring cables are melted by said heat, whereby the wiring cables are mutually electrically contacted and as a result, they are shorted.

In particular, in the case where a great number of solar cell modules are installed on a large area roof of a building to establish a solar cell array on the roof and the solar cell array is electrically connected to an inverter provided at a desired position of the building, when the roof is subject to a spreading fire and the fire is extinguished in the early stages, there is such an occasion that the roof is partly damaged and some of the solar cell modules constituting the solar cell array survive without their power generation function being deteriorated but with their wiring cables being partially damaged due to heat radiated from the fire.

In this case, when sunlight is impinged in these surviving solar cell modules to generate electricity, a problem is liable to entail such that water used in the fire extinguishing promotes the leakage from or the short at the damaged portions of the wiring cables. When the leakage or short should be promoted in this way, there is a fear that a fire will reoccur or worker(s) engaged in the repair work will suffer from electric shock.

In order to deal with such problems, the inverter for the solar cell array is provided with a mechanism which functions to detect and signal an anomaly such as a leakage or a short occurred in the solar cell array and also functions to automatically earth the power input portion of the solar cell array to the inverter when the occurrence of the anomaly is signalled. Thus, for instance, when leakage occurs in the solar cell array, as the occurrence of such an anomaly is detected and signalled and the power input portion extending from the surviving solar cell modules to the inverter is earthed by the mechanism of the inverter, the worker engaged in the repair work is prevented from suffering from electric shock.

However, when the worker inadvertently touches the damaged portions of the wiring cables of the surviving solar cell modules, it takes a certain period of time until the incident is judged as a leakage and the power input portion extending from the surviving solar cell modules to the inverter is earthed by the mechanism of the inverter. In this case, since it takes a certain period of time until earthing of the power input portion extending from the survived solar cell modules is completed, there is an occasion in that the worker suffers from electric shock.

In order to prevent the occurrence of such a problem, it is considered that a high speed control mechanism capable of immediately judging ouch an incident as above-described as an anomaly and immediately earthing the power input portion extending from the surviving solar cell modules is provided at the inverter. But such a high speed control mechanism is not available. If such a high speed control mechanism should be acquired, a sunlight power generation apparatus comprising a solar cell array and an inverter provided with such a high speed control mechanism becomes costly.

SUMMARY OF THE INVENTION

The present invention has been accomplished as a result of extensive studies by the present inventors in order to solve the foregoing problems in the prior art.

An object of the present invention is to provide a solar cell module having a wiring member with a heat-sensitive circuit cut-off means which is actuated promptly upon the application of heat with a prescribed temperature to cut off the electric connection between solar cell modules or the like.

Another object of the present invention is to provide a solar cell array comprising a plurality of solar cell module strings having a wiring member with said heat-sensitive circuit cut-off means which are electrically connected with each other in parallel.

A further object of the present invention is to provide a sunlight power generation apparatus comprising at least said solar cell array and an inverter.

The term "solar cell module" in the present invention means a structural body comprising a plurality of solar cells (photovoltaic elements) electrically connected with each other in series while being sealed by means of a sealing material including an organic sealing resin. The term "solar cell module string" means a string comprising a plurality of solar cell modules arranged while being electrically connected with each other in series.

The solar cell module and the solar cell array according to the present invention have such advantages as will be described below.

For instance, in the case where a plurality of solar cell modules having a wiring member with a heat-sensitive circuit cut-off means are installed, for instance, on a roof of a building while electrically connecting them to each other in series and the solar cell modules are electrically connected to an inverter through their power output portion, when a fire occurs near the building, the roof is partly damaged due to the spreading fire, and the fire is extinguished in the early stages, while some of the solar cell modules are damaged with respect to their wiring members due to heat radiated from the fire without their power generation functions being deteriorated, the heat-sensitive circuit cut-off means of these solar cell modules are actuated immediately upon the application of heat with a high temperature thereby to cut off the electric connection of these solar cell modules to their power output portion connected to the inverter. In this connection, even when sunlight is impinged in these solar cell modules, leakage from and short at the damaged portions of their wiring members are prevented from occurring. In this case, even when the damaged portions are contacted with water used to extinquish the fire, no fire reoccurs. In addition, the worker engaged in the repair work is prevented from suffering from electric shock. Thus, the safety of the solar cell module is assured.

This situation is similar in the case of the solar cell array according to the present invention.

For instance, in the case where a solar cell array according to the present invention which comprises a plurality of solar cell module strings having a wiring member with a heat-sensitive circuit cut-off means electrically connected with each other in parallel is installed, for instance, on a roof of a building and a power output portion extending from the solar cell module strings is electrically connected to an inverter, when a fire occurs near the building, the roof is partly damaged due to the spreading fire, and the fire is extinguished in the early stages, while some of the solar cell module strings are damaged with respect to their wiring members due to heat radiated from the fire without their power generation functions being deteriorated, the heat-sensitive circuit cut-off means of these solar cell module strings are actuated immediately upon the application of heat with a high temperature thereby to cut off the electric connection of these solar cell module strings to their power output portion connected to the inverter. In this connection, even when sunlight is impinged in these solar cell module strings leakage from and short at the damaged portions of their wiring members are prevented from occurring. In this case, even when the damaged portions are contacted with water used to extinguish the fire, no fire reoccurs. In addition, the worker engaged in the repair work is prevented from suffering from electric shock. Thus, the safety of the solar cell array is assured.

The circuit out-off means in the present invention is desired to actuate upon the application of heat with a high temperature of more than 150° C, which is, however, less than the temperature at which the power generation function of the solar cell (the photovoltaic element) in the solar cell module is deteriorated. In addition, the circuit cut-off means is desired to be provided while being joined with a member having a high thermal conductivity.

BRIEF DESCRIPTION OF THE DRAWINGS

FIG. 11(B) is a schematic cross-sectional view of the heat-sensitive circuit cut-off means shown in FIG. 11(A), taken along the line X–X' in FIG. 11(A).

FIG. 14 is a schematic view illustrating an example of a trunk connector used in the solar cell array shown in FIG. 13.

FIG. 15(B) is a schematic cross-sectional view of the heat-sensitive circuit cut-off means shown in FIG. 15(A), taken along the line X–X' in FIG. 15(A).

DETAILED DESCRIPTION OF THE INVENTION AND PREFERRED EMBODIMENTS

The present invention aims to solve the foregoing problems found in the prior art and to attain the above-described objects.

As previously described, the present invention provides a solar cell module having a wiring member with a heat-sensitive circuit cut-off means which is actuated promptly upon the application of heat with a prescribed temperature to cut off the electric connection between solar cell modules or the like.

The present invention also provides a solar cell array as a sunlight power generation system in which a number of solar cell modules are used. Specifically, the solar cell array comprises a plurality of solar cell module strings each comprising a plurality of solar cells electrically serialized with each other and having a wiring member with the foregoing heat-sensitive circuit cut-off means, wherein said plurality of solar cell module strings are electrically connected with each other in parallel.

The solar cell module and the solar cell array according to the present invention are assured particularly in terms of fire countermeasure and safety.

The present invention further provides a sunlight power generation apparatus comprising at least said solar cell array and an inverter.

In the following, the present invention will be detailed with reference to the drawings.

Figure 1:
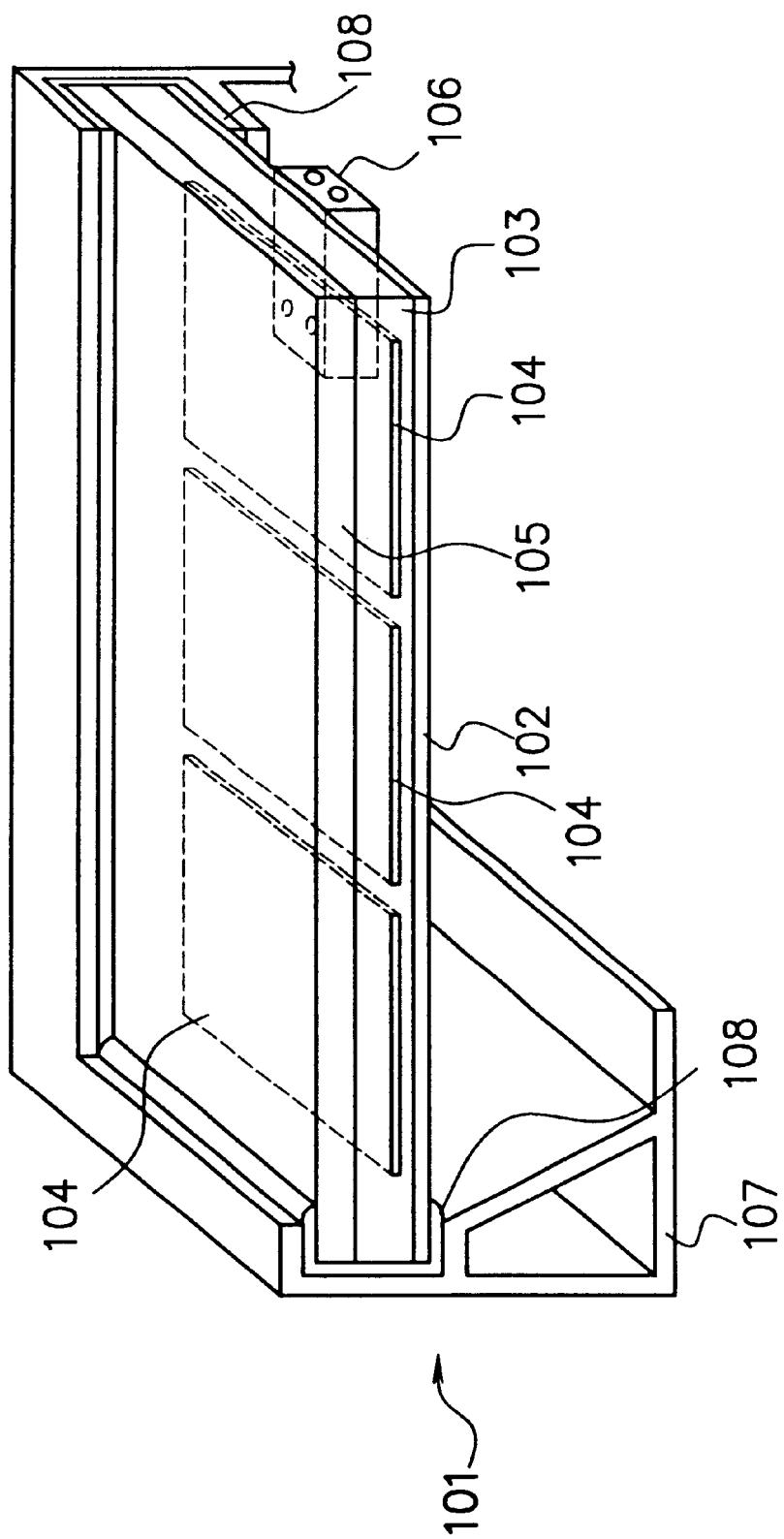
FIG. 1 is a schematic view illustrating an example of a solar cell module according to the present invention.

FIG. 1 is a schematic view illustrating an example of a solar cell module according to the present invention. In FIG. 1, reference numeral 101 indicates the entirety of a solar cell module. Reference numeral 102 indicates a backside covering member, reference numeral 103 a filler, reference numeral 104 a solar cell (or a photovoltaic element), reference numeral 105 a surface side covering member, reference numeral 106 a terminal box, reference numeral 107 a frame body, and reference numeral 108 a sealing member.

The solar cell module 101 shown in FIG. 1 comprises a solar cell module body supported by a supporting means comprising a frame body 107. The supporting means is used to make the solar cell module body have mechanical strength. The supporting means is not limited to this frame body but may be other appropriate supporting means. The supporting means is used when required and, therefore, is not always necessary.

Said solar cell module body comprises a plurality of solar cells 104 (photovoltaic elements) electrically serialized with each other enclosed by a filler 103, a surface side covering member 105 laminated on the front side of the filler 103 in which the serialized solar cells 104 are enclosed, and a backside covering member 102 laminated on the backside of the filler 103 in which the serialized solar cells 104 are enclosed. A terminal box 106 is fixed to a desired position of the rear face of the backside covering member 102.

Figure 2:
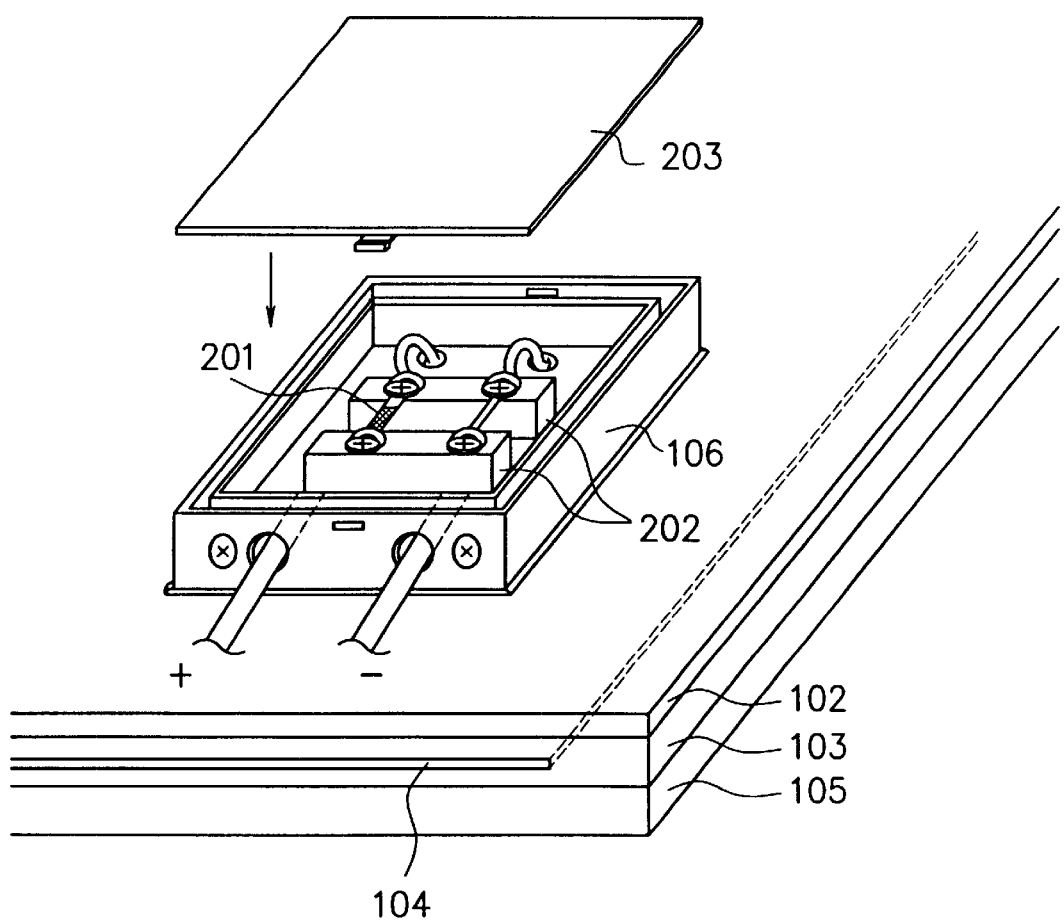
FIG. 2 is a schematic enlarged view illustrating a terminal box in the solar cell module shown in FIG. 1.

A sealing member 108 made of an insulating material is provided at the rear face of the backside covering member 102 for the purpose of tightly sealing between the solar cell module body and the supporting means (the frame body 107) to prevent water invasion FIG. 2 is a schematic enlarged view of the terminal box 106 in the solar cell module 101 shown in FIG. 1. As shown in FIG. 2, the terminal box has a trunk terminal platform 202 provided with a heat-sensitive circuit cut-off means 201 arranged therein. Reference numeral 203 indicates a cap for the terminal box. The terminal box is double-structured as shown in FIG. 2 so as to have good watertightness.

Figure 3:
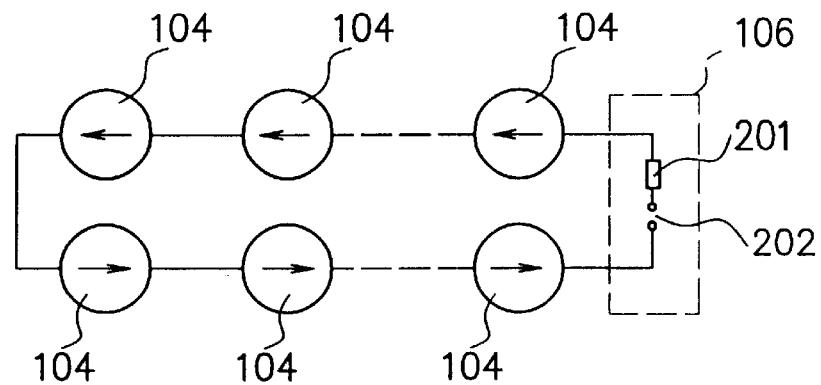
FIG. 3 is a schematic view illustrating an electric circuit in the solar cell module shown in FIG. 1.

FIG. 3 is a schematic view illustrating an electric circuit in the solar cell module shown in FIG. 1. As shown in FIG. 3, in the electric circuit of the solar cell module shown in FIG. 1, the solar cells 104 are electrically serialized with each other, and they are electrically serialized with the heat-sensitive circuit cut-off means 201 provided at the terminal platform 202.

In the following, description will be made of each constituent of the above-described solar cell module.

Backside Covering Member 102

As the backside covering member 102, there can be used TEDLAR film (trademark name, produced by Du Pont Company) which is often used in a super-straight structure, steel members which are used in metal roofs, corrosion-resistant non-ferrous metal members, plastic members, ceramic members, and layered members comprising these members. The steel member can include steel sheets applied with surface treatment or/and coating, other alloy sheets applied with surface treatment or/and coating, special steel sheets, composite sheets comprising heat insulating materials and the like laminated. Preferable specific examples are hot-dip zinc-coated steel sheets, galvanized steel sheets, hot-dip aluminum-coated steel sheets, copper-coated steel sheets, vinyl chloride-coated steel sheets, fluororesin-coated steel sheets, stainless steel sheets, laminated damping steel sheets, heat insulating zinc-plated steel sheets, and atmospheric corrosion-resisting steel sheets. Preferable specific examples of the non-ferrous metal member are aluminum-alloy sheets, zinc-alloy sheets, lead sheets, titanium sheets, and coated color sheets. Preferable specific examples of the plastic member are fiber-reinforced plastic sheets and sheets comprising plastic materials and metallic materials.

Filler 103

The filler 103 comprises a filler adhesive and a filler-retaining material. As the filler adhesive, there is used an adhesive resin which provides sufficient adhesion and relaxation effect for the solar cell 104 and which excels in weatherability and transparency. Preferable specific examples of such an adhesive resin are EVA (ethylene-vinyl acetate copolymer), PVB (polyvinyl butyral) and silicone resins. The filler-retaining material is used by burying it in the filler adhesive in order to make the filler have sufficient mechanical characteristics. Preferable specific examples of the filler-retaining material are nonwoven glass fibers, woven glass fibers, and fine particles of inorganic materials such as silica or $TiO_2$. If necessary, the nonwoven glass fiber or woven glass fiber may be used after it is subjected to surface treatment using a silane coupling agent.

Solar Cell 104

For the solar cell 104 (the photovoltaic element), there is no particular limitation for the kind thereof. The solar cell 104 may be a single-crystalline series solar cell, a polycrystalline series solar cell, a microcrystalline series solar cell, or an amorphous series solar cell. As a typical example of the amorphous series solar cell, there can be mentioned an amorphous silicon (a-Si) solar cell having a semiconductor layer comprising an amorphous silicon (a-Si) material.

In the solar cell module 101 shown in FIG. 1, a prescribed number of solar cells of one of these kinds are electrically serialized with each other by means of an electric wiring means such as an interconnector or the like so as to provide a desired voltage. The solar cells thus serialized are enclosed in the filler 103. There is no particular limitation for said voltage. However, in the case where a plurality of solar cell modules each having such a configuration as shown in FIG. 1 and having the heat-sensitive circuit cut-off means 201 as previously described are arranged while being electrically connected with each other, in view of the safety in a case where at least one of these solar cell modules is disconnected from the others by a worker, the voltage provided by each solar cell module is preferred to be 30 V or less which is not harmful for the worker.

Surface Side Covering Material 105

The surface side covering material 105 is required to comprise a material which excels in weatherability (including moisture resistance), transparency, scratch resistance and durability. As such a material, there can be mentioned, for example, glass plates, fluorine-containing resins (fluororesin), and the like.

As typical examples of the glass plate, there can be mentioned soda lime glass plates, low iron glass plates excelling in transparency, and the like. Of these, tempered glass plates are preferable in view of work efficiency. In the case where such a glass plate is used as the surface side covering material, it is desired for the solar cell module body to be provided with the supporting means comprising, for instance, the frame body 107 in order for the solar cell module body to have improved mechanical strength. In the case where the frame body 107 is used, it is desired to provide the sealing member 108 between the frame body 107 and the solar cell module body in order to tightly seal between the frame body and the solar cell module body to prevent water invasion.

As above-described, the surface side covering material may comprise an appropriate fluororesin. Such fluororesin can include, for example, copolymer of TFE (tetrafluoroethylene) [trademark name:TEFLON, produced by Du Pont Company]; ethylene-tetrafluoroethylene copolymer (ETFE) [trademark name: TEFZEL, produced by Du Pont Company]; polyvinyl fluoride(PVF) [trademark name: TEDLAR, produced by Du Pont Company]; and chlorotrifluoroethylene (CTFE) (trademark name: NEOFRON, produced by Daikin Kohgyo Kabushiki Kaisha). These resins may contain a conventional UV absorber in order to improve their weatherability.

The surface side covering material may comprise a fluororesin film made of any of these fluororesins. In order to improve the adhesion of the fluororesin film with the filler 103, it is preferred for the fluororesin film to have a roughened surface formed by way of corona-discharging surface treatment which is contacted with the filler. Further, the fluororesin film as the surface side covering material is desired to be of the non-oriented type in order to be able to comply with various bending treatments.

Terminal Box 106

The terminal box 106 is a box to accommodate the terminal platform 202 for outputting an electric power generated by the solar cells 104. The terminal box 106 comprises this box and the cap 203.

The terminal box 106 is provided at the non-light receiving side of the solar cell module body (that is, at the rear face of the backside covering member 102) in many cases, as shown in FIG. 1.

The terminal box is required to excel in watertightness. For this purpose, the terminal box is double-structured as shown in FIG. 2. Besides, the inside of the terminal box may be charged with a sealing material in order to ensure watertightness.

The terminal box is constituted by a material excelling in heat resistance, waterproofness, and aging resistance and having excellent electrically insulating properties. As such a material, fire-resistant plastics are particularly preferable. Such plastics can include engineering plastics which excel in physical strength, shock resistance, heat resistance, hardness, and aging resistance. Specific examples are polycarbonate, polyamide, polyacetal, modified PPO (denaturalization polyphenylene oxide), polyester, polyarylate, unsaturated polyester, phenol resin, and epoxy resin. Other than these, thermoplastics such as ABS resin (acrylonitrile butadiene styrene polymer), PP (polypropylene), and PV (polyvinyl chloride) are also usable depending upon the situation involved.

Besides, the terminal box may be constituted by a ceramic or a metallic material applied with insulating treatment depending upon the situation involved.

Heat-Sensitive Circuit Cut-Off Means 201

The heat-sensitive circuit cut-off means 201 functions to cut off the electric connection involved when heat with a prescribed temperature is applied thereto. The heat-sensitive circuit cut-off means 201 comprises a material which is melted or deformed upon the application of heat with a prescribed temperature thereby to cut off the electric connection where the heat-sensitive circuit cut-off means is present. The material constituting the heat-sensitive circuit cut-off means 201 can include a thermal fuse, a solder, a brazing metal, a shape memory alloy and combinations of these. For instance, in the case where a thermal fuse is used as the heat-sensitive circuit cut-off means 201, when a fire occurs in the vicinity thereof, the thermal fuse melts and is disconnected due to heat radiated from the fire, whereby the electric connection where the thermal fuse is present is cut off. For the foregoing prescribed temperature, detailed description will be made later, but a temperature which is higher than 150° C. but lower than the temperature at which the solar cell loses power generation function is intended.

The heat-sensitive circuit cut-off means 201 may be of a functionally divided structure comprising a heat-sensitive means and a circuit cut-off means.

The heat-sensitive means in this case may comprise a material which can be melted or deformed at a prescribed temperature or a material having an adhesive property which can be deteriorated at a prescribed temperature. As such a material, there can be mentioned a thermal fuse, a solder, a brazing metal, and a shape memory alloy, a resin having an adhesive property, and combinations of these. The heat-sensitive means serves also as a fixing means. The prescribed temperature in this case means a temperature which is higher than 150° C. but lower than the temperature at which the solar cell loses power generation function, as in the above-described case.

The circuit cut-off means is a means which actuates when the heat-sensitive means is affected by heat to deform or the like, thereby cutting off the electric connection where the heat-sensitive circuit cut-off means is present. The circuit cut-off means in this case may comprise an elastic body such as a coiled spring, a blade spring or the like or a shape memory alloy.

In a typical embodiment of the functionally divided heat-sensitive circuit cut-off means comprising such heat-sensitive means and such circuit cut-off means, the circuit cut-off means and the electric connection (the electric wiring) involved are fixed by the heat-sensitive means, and upon the application of heat with a prescribed temperature, the heat-sensitive means is deformed, melted or deteriorated with respect to its adhesive property, i.e., loses fixing ability, whereby the circuit cut-off means is deformed to disconnect the electric connection.

For a brazing metal used as the heat-sensitive means, it has good electric conductivity and because of this, it can be used as a part of the electric connection (the electric wiring). Thus, the brazing metal is preferable as the material constituting the heat-sensitive means. It is the most preferable for the heat-sensitive means to comprise a solder, because the solder can be readily handled and it excels in weatherability. The solder can include Sn—Ag solder (melting point: about 230° C. to about 320° C.), Sn—Pb solder (melting point: about 180° C. to about 330° C.), Pb—Ag solder (melting point: about 290° C. to about 310° C.), and Zn—Ag solder (melting point: about 450° C.).

Incidentally, in the case where the heat-sensitive circuit cut-off means comprises the heat-sensitive means and the circuit cut-off means in the present invention, there Is an embodiment shown in FIG. 12(B) (which will be detailed later) where an electricity generated by the solar cell module does not always flow to the heat-sensitive means and the circuit cut-off means. In this embodiment, it is not always required for the constituent material of each of the heat-sensitive means and the circuit cut-off means to be electrically conductive.

Besides, the present invention includes another embodiment in that the heat-sensitive means comprises a temperature sensor and the circuit cut-off means comprises a switching circuit which actuates depending on a prescribed change in the electric signal from the temperature sensor, wherein the electric connection (the electric wiring) is cut off upon the application of heat with a prescribed temperature. For this system, there can be used, for instance, an electric device with a temperature breaker or the like.

By the way, the results of experiments by the present inventors with respect to changes in the temperature of the solar cell module positioned outdoors to be exposed to sunlight revealed that the temperature of the solar cell module is sometimes heightened to exceed 120° C. due to heat from sunlight irradiated on the solar cell module. Here, if the foregoing prescribed temperature at which the heat-sensitive circuit cut-off means actuates (this temperature will be hereinafter referred to as "cut-off temperature" for simplification purposes) should be excessively lower than aforesaid temperature of the solar cell module, the heat-sensitive circuit cut-off means actuates although no fire has occurred. Therefore, the cut-off temperature is necessarily to be higher than a certain temperature. That is, the cut-off temperature is necessarily to be settled in accordance with the environment where the solar cell module is used.

Based on the results of experiments by the present inventors, there was obtained a finding that even in the case where a black material whose absorption factor for sunlight is very high and which readily generates heat upon the irradiation of sunlight is used as the backside covering member of a solar cell module, when the cut-off temperature has a margin of about 30° C. it is possible to sufficiently prevent the heat-sensitive circuit cut-off means from being erroneously actuated. Based on this finding, it was found that the cut-off temperature of the heat-sensitive circuit cut-off means is necessarily higher than 150° C.

Now, if the heat-sensitive circuit cut-off means does not actuate until a temperature at which the solar cell 104 itself loses power generation function, the presence of the heat-sensitive circuit cut-off means is meaningless. In this connection, the cut-off temperature of the heat-sensitive circuit cut-off means is necessarily lower than the temperature at which the solar cell 104 itself loses power generation function. For the temperature at which the solar cell 104 itself loses power generation function, it differs somewhat depending on the kind of material constituting the semiconductor layer of the solar cell. Hence, the upper limit for the cut-off temperature of the heat-sensitive circuit cut-off means should be determined depending on the kind of solar cell used in the solar cell module. Specifically, for instance, in the case where the solar cell is an amorphous silicon (a-Si) solar cell, the upper limit of the cut-off temperature is about 230° C. or less. In the case where the solar cell is a crystalline series solar cell, the upper limit of the cut-off temperature is about 800° C. or less.

There is no particular limitation for the installation position of the heat-sensitive circuit cut-off means. However, it is preferable to arrange the heat-sensitive circuit cut-off means in the terminal box 106, in an interconnector which electrically connects adjacent solar cells, or in the filler of the solar cell module. In the case of a solar cell module having a backside covering member, a frame body or a coupling type connector to electrically connect the solar cell module with a solar cell module adjacent thereto, the heat-sensitive circuit cut-off means may be arranged at said backside covering member, said frame body or said coupling type connector. In the case of a solar cell module provided with a terminal box (106) having an easy-to-open-and-shut cap (203) as shown in FIGS. 1 and 2, it is more preferable to arrange the heat-sensitive circuit cut-off means in the inside of the terminal box. In the case where a plurality of solar cell modules each having a terminal box (106) with an easy-to-open-and-shut cap (203) and having the heat-sensitive circuit cut-off means provided in the inside of said terminal box are installed, for instance, on a roof of a building with the solar cell modules being electrically connected with each other, when a fire occurs in the vicinity of the building and the fire is extinguished in the early stages, and the roof is partly damaged together with some of the solar cell modules due to the spreading fire, in the repair work of the roof, the heat-sensitive circuit out-off means positioned in the terminal box of each of the surviving solar cell modules can be readily changed to new ones and these solar cell modules can be reused.

In the case of a solar cell module having a material having high thermal conductivity as a constituent thereof, the heat-sensitive circuit cut-off means is more preferably to arranged in the vicinity of said material for the reason that heat readily conducts to the heat-sensitive circuit cut-off means to provide an improvement in the dynamic sensitivity of the heat-sensitive circuit cut-off. In a furthermore preferred embodiment, the heat-sensitive circuit cut-off means is arranged so as to contact said material.

In the case where the heat-sensitive circuit cut-off means comprises the heat-sensitive means and the circuit cut-off means as previously described, it is preferred that at least the heat-sensitive means is arranged in the vicinity of the above-described material. It is more preferred that at least the heat-sensitive means is arranged so as to contact the above-described material.

Thus, in the case where the heat-sensitive circuit cut-off means is arranged in the vicinity of or in contact with the foregoing terminal box, the foregoing interconnector, the foregoing filler, the foregoing backside covering member, the foregoing frame body or the foregoing coupling type connector, at least one of these which is involved in the arrangement of the heat-sensitive circuit cut-off means is desired to be constituted by a material having high thermal conductivity from the viewpoint of improving the dynamic sensitivity of the heat-sensitive circuit cut-off means.

By the way, in the case where the heat-sensitive circuit cut-off means or the heat-sensitive means is electrically conductive, there is a tendency in that when the heat-sensitive circuit cut-off means or the heat-sensitive means contacts the material having high thermal conductivity, the heat-sensitive circuit cut-off means or the heat-sensitive means is occasionally earthed. The occurrence of this problem can be prevented by interposing an appropriate insulating member between the material having high thermal conductivity and the heat-sensitive circuit cut-off means or the heat-sensitive means. As said insulating member, it is preferred to use an insulating member having high thermal conductivity. As preferable specific examples of such members, there can be mentioned insulating members comprising one or more materials selected from the group consisting of epoxy resins, urea resins, ceramics, glass chips, and metal oxides Here, the thermal conductivity of the ceramic is in the range of about 50 W/m·K to about 100 W/m·K. The thermal conductivity of the glass chip is in the range of about 5.5 W/m·K to about 7.5 W/m·K.

These insulating members are desired to be thin in order for them to have good thermal conductivity. In this connections the insulating member is preferred to have a thickness in the range of 0.1 mm to 2 mm.

Now, in the case where a plurality of solar cell modules each having a surface side covering member and a backside covering member and having a frame body and a terminal box provided at the rear face of the backside covering member are electrically connected with each other through their coupling type connectors, in each of the adjacent solar cell modules, their frame bodies, their backside covering members and their coupling type connectors are usually in contact. Therefore, for instance, when one of these solar cell modules suffers from a fire, the heat of the solar cell module conducts to other solar cell modules situated next to the solar cell module through their frame bodies, backside covering members and coupling type connectors. In this connection, it is preferred for the heat-sensitive circuit cut-off means to be arranged at the frame body, at the backside covering member, at the inside of the terminal box or at the coupling type connector of the solar cell module from the viewpoint of improving the dynamic sensitivity of the heat-sensitive circuit cut-off means.

In the case where the heat-sensitive circuit cut-off means is arranged at the frame body or the backside covering member, because the frame body and the backside covering member have a large area and, therefore, they have portions to contact the adjacent solar cell modules, the heat of the former promptly conducts to the latter solar cell module. In this connection, the heat-sensitive circuit cut-off means arranged at the frame body or the backside covering member readily receives heat radiated from a spreading fire when a fire occurs in the vicinity of the solar cell module involved. Thus, the frame body and the backside covering member are more preferable positions in which to arrange the heat-sensitive circuit cut-off means. From the viewpoint of further improving the dynamic sensitivity of the heat-sensitive circuit cut-off means, the frame body or the backside covering member is preferred to be constituted by a material having high thermal conductivity such as a metal.

In the following, description will be made of the solar cell array according to the present invention.

Figure 4:
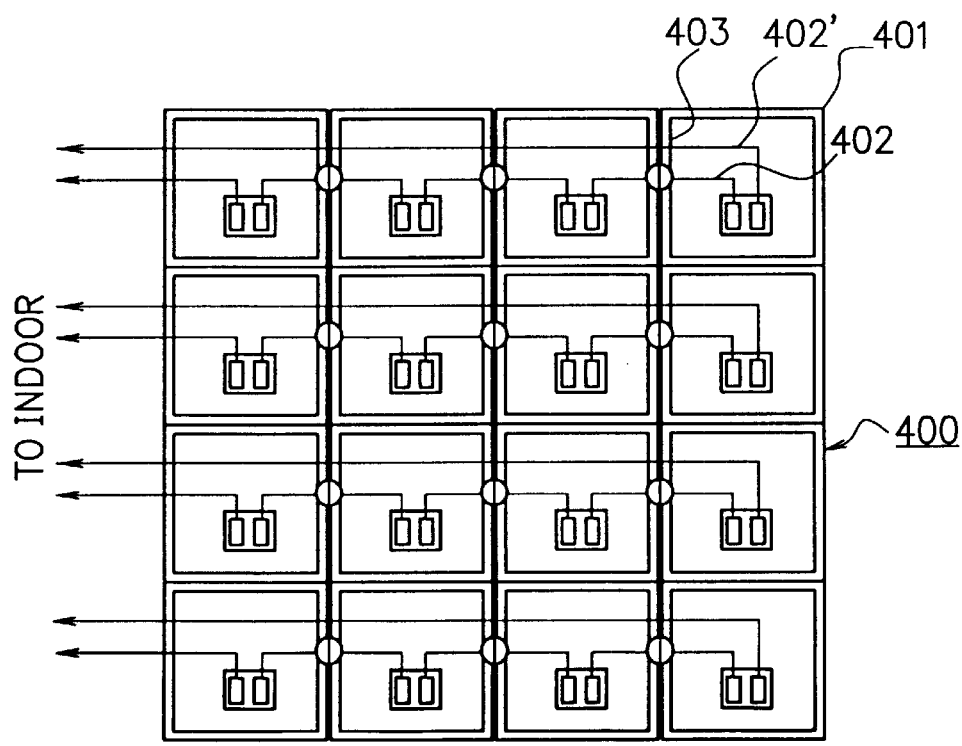
FIG. 4 is a schematic plan view illustrating an example of a solar cell array according to the present invention.

FIG. 4 is a schematic plan view illustrating an example of a solar cell array according to the present invention.

In FIG. 4, reference numeral 400 indicates a solar cell array comprising a plurality of solar cell modules 401 electrically connected in series and in parallel. Particularly, the solar cell array shown in FIG. 4 comprises a plurality of solar cell module strings laterally arranged, each comprising a plurality of solar cell modules 401 electrically connected with each other in series through a wiring cable 402 and a connector 403. Each of the solar cell module strings has a pair of extending cables which are extended into the interior of a house, one of the two extending cables comprising the serialized wiring cable 402 extending from the solar cell module situated on one end side of the solar cell module string, and the other extending wiring cable comprising a wiring cable 402' extending from the solar cell module situated on the other end side of the solar cell module string These extending wiring cables of the solar cell module string are gathered in a switchboard or the like provided in the interior of the house, where they are electrically connected in parallel, whereby the solar cell module strings are electrically connected in parallel. The solar cell array is wired to various power conditioners.

In the following, description will be made of each constituent of the solar cell array.

Solar Cell Module 401

As the solar cell module, basically, there can be used a solar cell module having a configuration similar to that of the previously described solar cell module 101.

For the position where the heat-sensitive circuit cut-off means is arranged in this embodiment, there is shown a case wherein the heat-sensitive circuit cut-off means is arranged at a location other than the solar cell module 401, although it is possible for the solar cell module 401 to be provided with the heat-sensitive circuit cut-off means as previously described.

Wiring Cable 402

There is no particular limitation for the wiring cable 402. However, it is necessary to use an appropriate wiring cable having relevant heat resistance to the environment where the solar cell module 401 is installed. Preferable examples of such wiring cable are insulating cables such as IV cable, KIV cable, HKIV cable, crosslinked polyethylene cable, fluoro rubber cable, silicone rubber cable, and fluororesin cable. Besides, VV cable, CV cable, CE cable, EE cable and cabtyre cable are also suitable for use.

Connector 403

Figure 5:
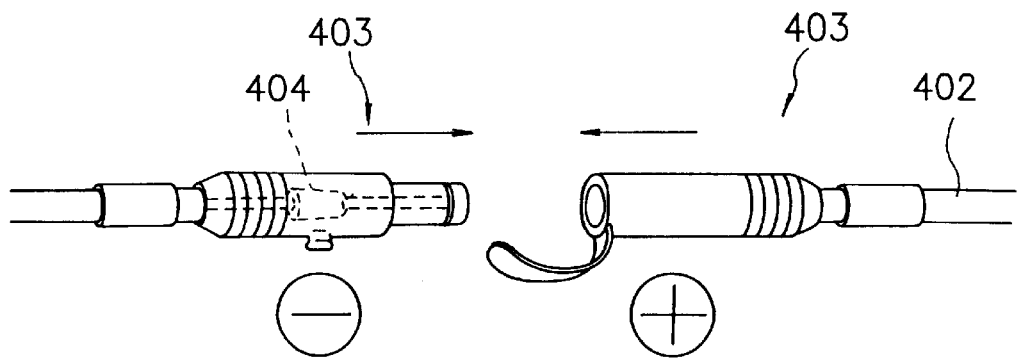
FIG. 5 is a schematic view illustrating an example of a connector used in the solar cell array shown in FIG. 4.
Figure 6:
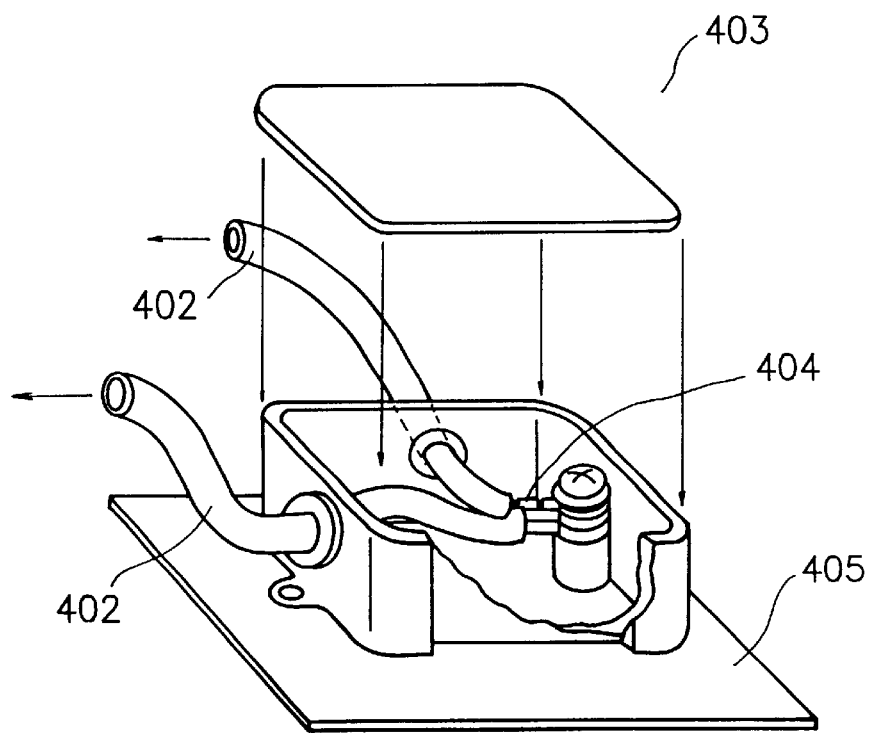
FIG. 6 is a schematic view illustrating another example of a connector used in the solar cell array shown in FIG. 4.

The connector 403 is used for electrically connecting a plurality of solar cell modules 401. Preferable examples of the connector 403 include a coupling type cable connector having such configuration as shown in FIG. 5 and a trunk type connector having such configuration as shown in FIG. 6 which is beforehand fixed to an installation face 405, wherein electric wirings are drawn to gather. In terms of the performance, it is desired for the connector to excel in waterproofness, to be free of the occurrence of a coating film having high resistance on the surface, and to have a stable and low contact resistance. In addition, the connector is desired to have a structure with a locking portion and whose terminal is never erroneously contacted with hands of a worker. For the waterproofness, it is desired to belong to the 7 grade waterproofness of JIS C0920. For the contact resistance, it is desired to be less than 10 mΩ when a short-circuit current of 10 mA is flowed. For the trunk type connector, it is desired to be constituted by any of the materials previously mentioned as the constituent of the terminal box.

Heat-Sensitive Circuit Cut-off Means

The location where the heat-sensitive circuit cut-off means is arranged will be explained with reference to FIGS. 5 and 6. The heat-sensitive circuit cut-off means 404 (see, FIGS. 5 and 6) is preferred to be arranged in the connector 403 (see, FIGS. 5 and 6). It is not necessary for the heat-sensitive circuit cut-off means to be arranged in all of the connectors 403. When the heat-sensitive circuit cut-off means is arranged at least just before a position where the wiring cables 402 are intersected or converged, it is possible to prevent the different wiring cables, which are different with respect to their polarities (plus and minus), from being contacted with each other. That is, there is an advantage in that by using as small a number of the heat-sensitive circuit cut-off means as possible, the occurrence of shorts among the wiring cables can be prevented, and therefore, the heat-sensitive circuit cut-off means can be effectively used. Particularly in the case where the installation face (405) (see, FIG. 6) is constituted by a thermally conductive material, it Is desired that such a trunk type connector as shown in FIG. 6 which can be installed on the installation face (405) separately from the solar cell modules is used as the connector 103 in the solar cell array shown in FIG. 4 and the heat-sensitive circuit cut-off means 404 is arranged in the inside of the connector (403) as shown in FIG. 6, for the reason that as the installation face (405) is constituted by the thermally conductive material, the dynamic sensitivity of the heat-sensitive circuit cut-off means is improved as previously described. Specifically, in the case of such a solar cell array as shown in FIG. 4 in which the outputs of the solar cell module strings are drawn into the interior of a house and are electrically connected with each other in parallel through the switchboard, the wiring cables 402 and 402' are converged at a position where the wiring cables are drawn and therefore, it is more preferred that the trunk type connector having the heat-sensitive circuit cut-off means installed therein is arranged just before said position, in terms of improving cost-effectiveness.

In the following, the advantages of the present invention will be described in more detail by reference to the following examples, which are provided merely for illustrative purposes and are not intended to limit the scope of the present invention.

EXAMPLE 1

Figure 7A:
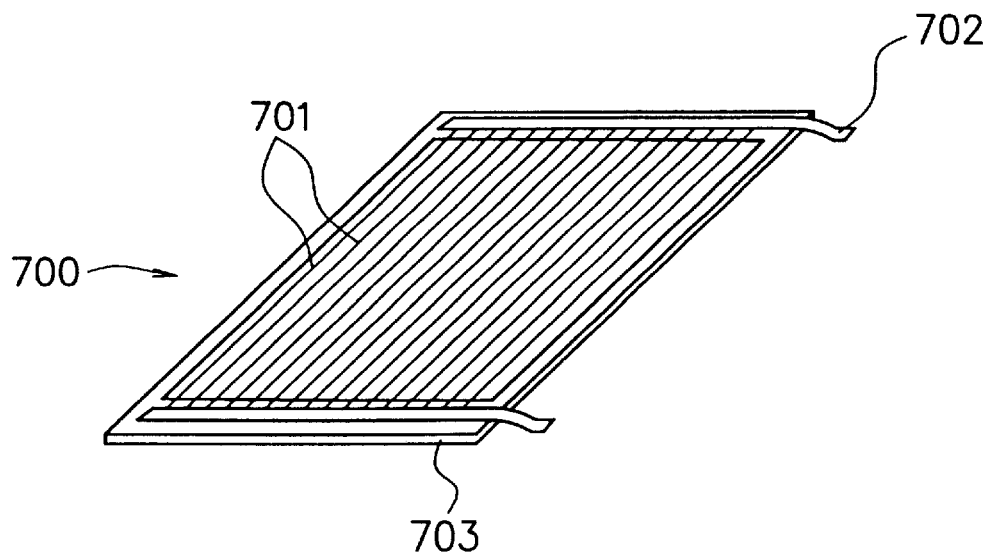
FIG. 7(A) is a schematic view illustrating an example of a solar cell (a photovoltaic element) used in the present invention, viewed from above.
Figure 7B:
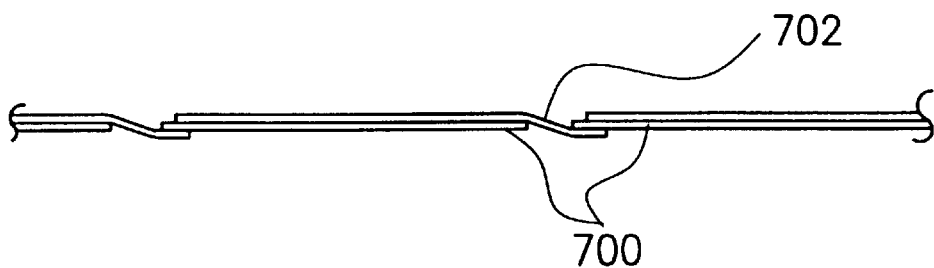
FIG. 7(B) is a schematic view illustrating an embodiment in which solar cells (photovoltaic elements) having the configuration shown in FIG. 7(A) are electrically serialized.
Figure 8:
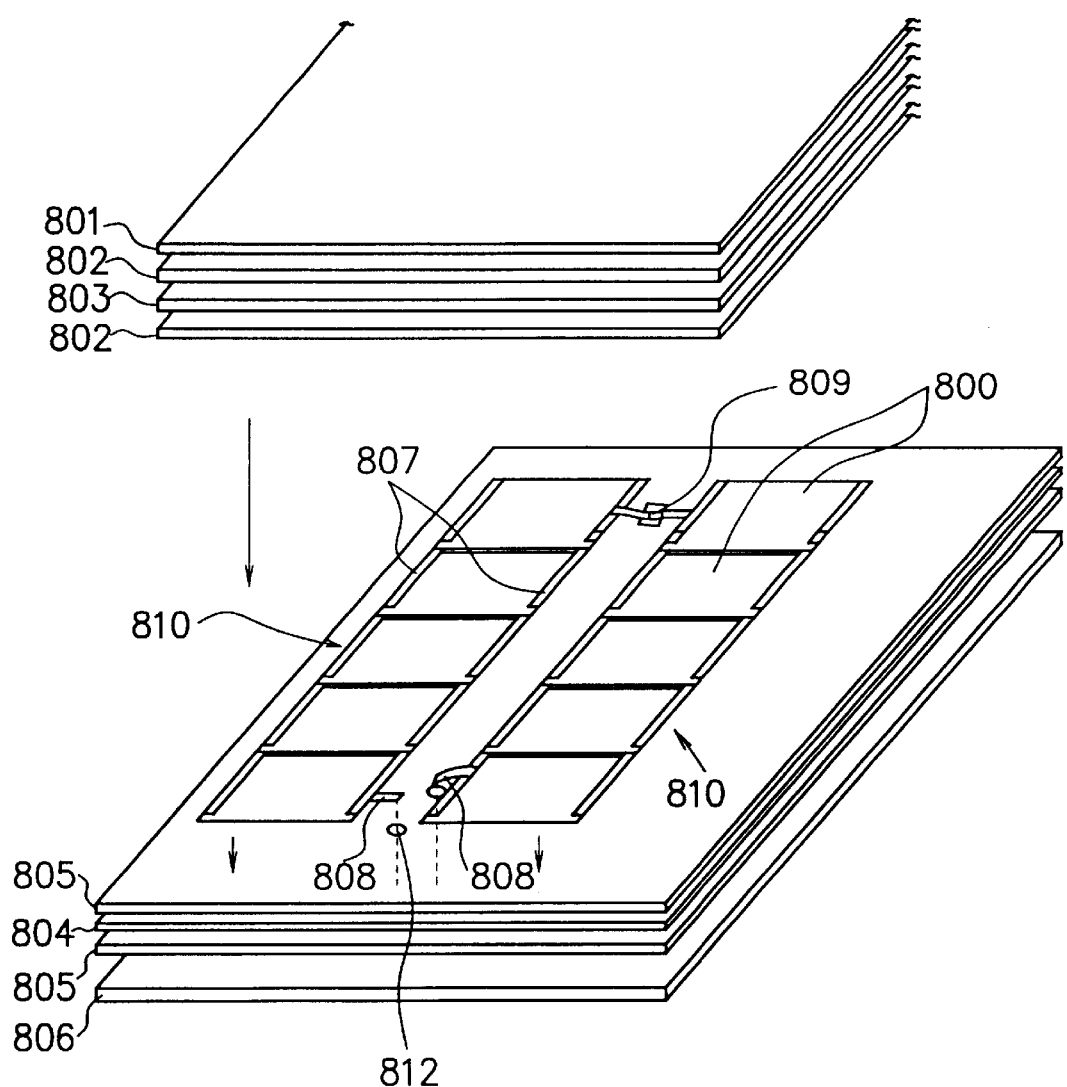
FIG. 8 is a schematic view illustrating an example of a covering structure of a solar cell module according to the present invention.

This example is based on FIGS. 7(A) and 7(B) and FIG. 8. This example will be described with reference to FIGS. 7(A) and 7(B) and FIG. 8.

FIG. 7(A) is a schematic view illustrating an example of a solar cell used in the present invention, viewed from above. FIG. 7(B) is a schematic view illustrating an embodiment in which a plurality of solar cells having the configuration shown in FIG. 7(A) are electrically serialized. In FIGS. 7(A) and 7(B), reference numeral 700 indicates an amorphous silicon (a-Si) solar cell, reference numeral 701 a collecting electrode (a grid electrode), reference numeral 702 an interconnector comprising an internal wiring member, and reference numeral 703 an insulating member comprising a polyimide tape.

The amorphous silicon solar cell 700 shown in FIGS. 7(A) and 7(B) comprises an amorphous silicon (a-Si) photovoltaic element (having a photoelectric conversion member) formed on a stainless substrate by way of CVD a collecting electrode 701 (a grid electrode) arranged on the light receiving face of the photovoltaic element, and an interconnector 702 (comprising an internal wiring member) arranged on each of the opposite sides of the light receiving face of the photovoltaic element through a polyimide tape 703 as an insulating member so as to contact the collecting electrode 701.

The collecting electrode 701 serves to efficiently output electric current generated by the solar cell (the photovoltaic element). The interconnector 702 serves to collect the electric current collected by the collecting electrode 701.

FIG. 7(B) shows an embodiment when a plurality of solar cells are electrically serialized with each other. Particularly, as shown in FIG. 7(B), a plurality of solar cells 700 having the configuration shown in FIG. 7(A) are electrically connected with each other in series by connecting their interconnectors 702 in series. The reason why a plurality of solar cells are serialized in this way is that when only one solar cell is used, the voltage provided is too small and therefore, in the case of using it as a solar cell module as a power generation source, it is necessary to electrically serialize a prescribed number of solar cells which can attain a desired voltage.

In this example, a rated voltage of 14 V can be attained by electrically serializing 10 solar cells having the configuration through their interconnectors as shown in FIG. 8 (the group comprising the 10 solar cells electrically serialized will be hereinafter referred to as "cell block" which is indicated by reference numeral 810 in FIG. 8).

Now, in the case where a plurality of solar cell modules 700 are electrically serialized with each other, since each solar cell has a pair of electrodes (that is, a positive electrode and a negative electrode), adjacent solar cell modules are electrically serialized by electrically connecting the positive electrode of one solar cell to the negative electrode of another solar cell. The interconnector 702 is used as a wiring means to perform the electric connection between the positive electrode and the negative electrode. In this case, it is necessary to ensure electrical insulation between the positive and negative electrodes of the solar cell. The polyimide tape 703 (the insulating member) is used for this purpose. Thus, the interconnector 702 is arranged on the solar cell through the polyimide tape 703.

Specifically, FIG. 8 shows an example of a covering structure of a solar cell module in this example.

The solar cell module shown in FIG. 8 comprises a cell block 810 (comprising a plurality of amorphous silicon (a-Si) solar cells 800 electrically serialized with each other) interposed between a surface side covering material and a backside covering material. The surface side covering material comprises a surface covering member 801 comprising an ETFE film, a surface side filler 802 comprising an EVA sheet, a filler-retaining member 803 comprising a crane glass sheet, and another surface side filler 802 comprising an EVA sheet. The backside covering material comprises a backside filler 805 comprising an EVA sheet, an insulating member 804 comprising a PET film, another backside filler 805 comprising an EVA sheet, and a back face reinforcing member 806 comprising a coated galvanized steel sheet which serves also as a support for the solar cell module. The insulating member 804 is used for ensuring electric insulation between the cell block 810 and the back face reinforcing member 806. Reference numeral 807 indicates an interconnector, reference numeral 808 an interconnector for a power output lead to output an electric power from the solar cells in the cell block 810 to the outside, and reference numeral 809 a heat-sensitive circuit cut-off means comprising a temperature fuse which comprises a 1 mm thick Sn—Ag solder foil whose melting point is 217° C. The temperature fuse 809 and the interconnector 807 were joined by way of laser heating.

The backside covering material is provided with a hole at a portion corresponding to the temperature fuse 809 and a pair of holes 812 through which a pair of power output leads are taken out to the outside.

The solar cell module shown in FIG. 8 was produced by stacking the lamination materials 805, 804, and 805 in this order on the back face reinforcing member 806, stacking the cell block 810 on the lamination member 805 (the EVA sheet), and stacking the lamination materials 802, 803, 802, and 801 in this order on the cell block 810 to obtain a stacked body, and subjecting the stacked body to thermocompression treatment using a conventional vacuum lamination apparatus. In this process, the temperature fuse 809 is compressed to the back face reinforcing member 806 through only the insulating member 804 because the EVA sheets 805 are heat-fused. Thus, the thermal conduction between the temperature fuse 809 and the back face reinforcing member 806 readily occurs. This means that the temperature fuse 809 and the back face reinforcing member 806 are thermally coupled.

In the above process, by arranging a silicone rubber plug in the power output holes 812 during the thermocompression treatment and detaching the silicone rubber plug after the thermocompression treatment, it is possible to prevent the electrode faces of the interconnectors 808 from being covered by a fused flow of the EVA.

At the position of the back face reinforcing member 806 where the power output holes 812 are present, there is terminal box (not shown in the figure) so that the output power of the solar cells can be outputted from the terminal box through wiring cables.

In this example, the temperature fuse 809 as the heat-sensitive circuit cut-off means is compressed to the steel sheet as the back face reinforcing member 806 through only the PET film as the insulating member 804. That is, the temperature fuse 809 and the back face reinforcing member 806 are arranged such that they are thermally coupled. Because of this, the dynamic sensitivity of the temperature fuse 809 as the heat-sensitive circuit cutoff means is good. For instance, in the case of a solar cell array in which a plurality of solar cell modules having the configuration shown in FIG. 8 are arranged while being electrically connected with each other, adjacent solar cell modules are situated such that their back face reinforcing members comprising the steel sheet are contacted with each other. Because of this, even when one of the solar cell modules in the solar cell array suffers from a spreading fire when a fire occurs in the vicinity of the solar cell array, the heat radiated from the fire promptly conducts to all the solar cell modules to promptly cut off the power output of the solar cell modules.

Thus, according to this example, it is possible to attain a solar cell module and a solar cell array which are markedly ensured in terms of safety.

Incidentally, when the solar cell module has such a frame body as shown in FIG. 1, the frame body also contributes to thermal conduction among the solar cell modules.

EXAMPLE 2

Figure 9A:
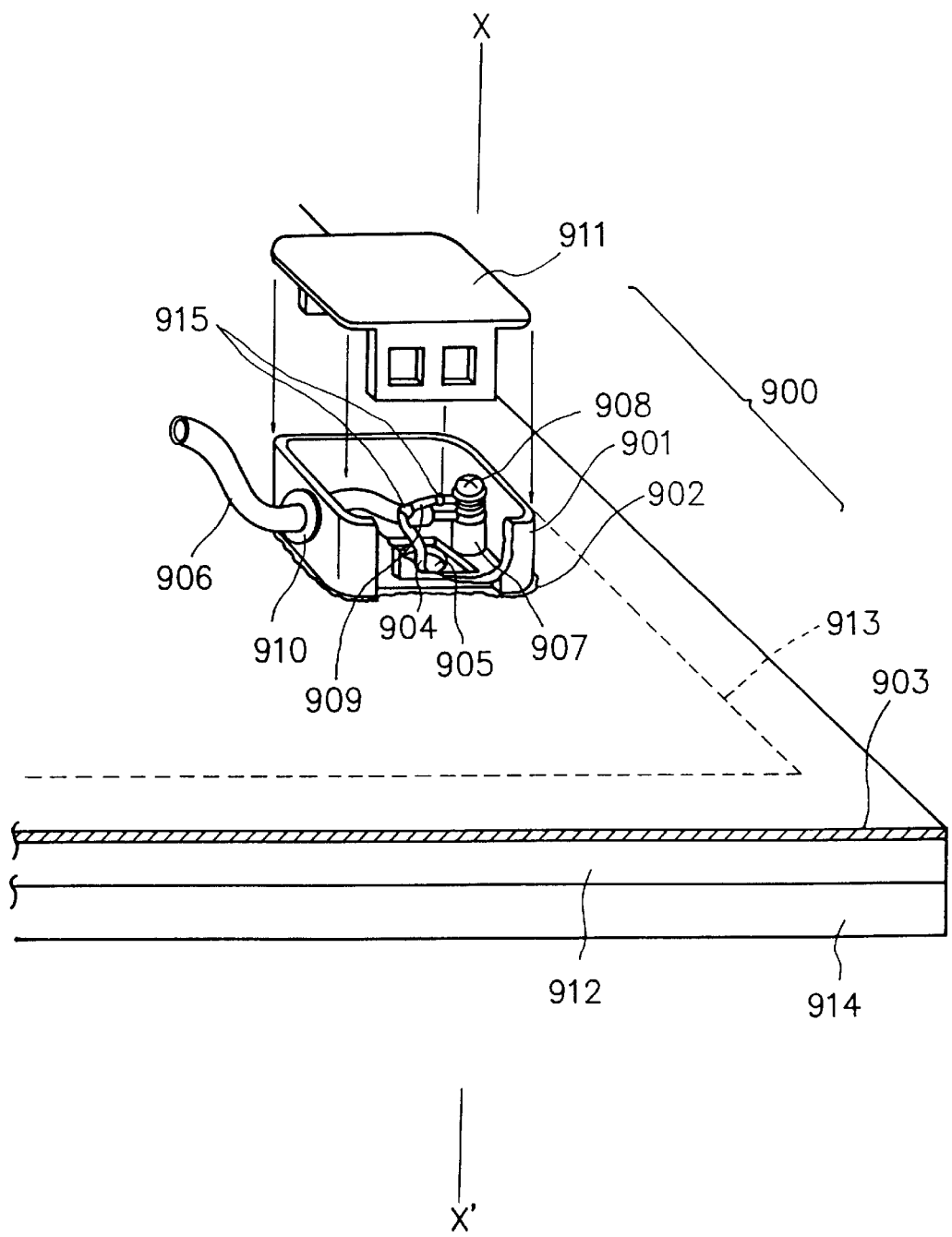
FIG. 9(A) is a schematic view illustrating an example of a terminal box used in a solar cell module according to the present invention.
Figure 9B:
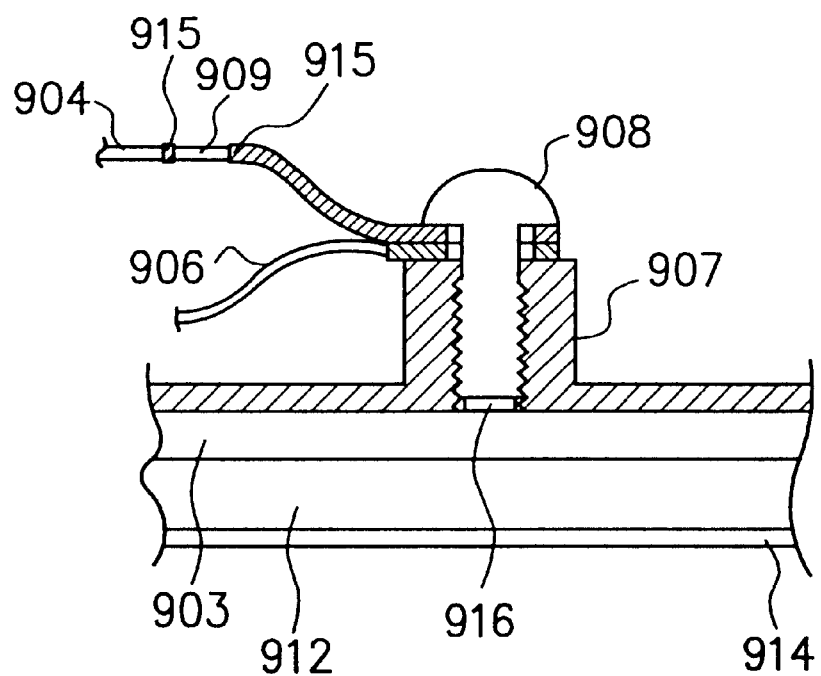
FIG. 9(B) is a schematic cross-sectional view taken along the line X–X' in FIG. 9(A).

This example is based on FIGS. 9(A) and 9(B). FIG. 9(A) is a schematic view illustrating an example of a terminal box used in a solar cell module. FIG. 9(B) is a schematic cross-sectional view, taken along the line X–X' in FIG. 9(A). Description will be made with reference to FIGS. 9(A) and 9(B).

Reference numeral 900 indicates a crystalline series solar cell module which comprises a crystalline series solar cell 913 enclosed in a filler 912, a surface covering member 914 comprising a glass plate and a backside covering member 903 comprising a coated galvanized steel sheet.

In this example, unlike the solar cell module in Example 1, no temperature fuse is present in the covering member.

Reference numeral 901 indicates a terminal box which serves to output power output lead 904 of the solar cell module 900 to the outside- The terminal box 901 is fixed to the rear face of the backside covering member 903 of the solar cell module 900 by means of a sealing material 902. The power output lead 904 of the solar cell module 900 is drawn out through a power output hole 905 of the solar cell module. The power output lead 904 comprises a wiring member for outputting an electric output from the interconnector embedded in the covering material of the solar cell module. Reference numeral 906 indicates a wiring cable for transmitting the electric output outside the solar cell module. The wiring cable 906 is wired into the inside of the terminal box 901 through a waterproof bush 910. It is required for the wiring cable 906 to have sufficient strength against external power such as tension or the like. In this connection, in the terminal box, its end portion is fixed to a terminal board 907 by means of a metal screw 908.

Reference numeral 909 indicates a heat-sensitive circuit cut-off means which comprises a temperature fuse comprising a bar-like shaped Sn—Pb solder member with a diameter of 3 mm having a melting point of 183° C. The temperature fuse 909 as the heat-sensitive circuit cutoff means is fixed to the power output lead 904 by means of a crimp-style terminal member 915. The power output lead 904 is fixed to the terminal board 907 through the temperature fuse 909 and the crimp-style terminal member 915.

The terminal board 907 is electrically isolated from the backside covering material 903 of the solar cell module 900. Reference numeral 916 indicates a screw-fixing member to fix the metal screw 908. The screw-fixing member 916 comprises a highly thermal-conductive epoxy adhesive T7109 (produced by EPO-TEK Company). The epoxy adhesive constituting the screw-fixing member 916 is electrically insulative and because of this, it electrically Isolates between the metal screw 908 and the backside covering material 903 of the solar cell module. In addition, the epoxy adhesive constituting the screw-fixing member 916 has a high thermal conductivity of 3 W/m·K. Because of this, by making the thickness of the screw-fixing member 916 to be about 0.5 mm, the thermal conductivity of the screw-fixing member 916 can be made to be satisfactory. Further, the metal screw 908 comprises a metallic material, and, therefore, its thermal conductivity is high. Because of these factors, thermal conduction from the backside covering material 903 of the solar cell module 900 to the temperature fuse 909 as the heat-sensitive circuit cut-off means is very good. This means that the temperature fuse 909 and the backside covering material 903 are thermally coupled.

When a fire occurs in the vicinity of the solar cell module, heat radiated to the backside covering material due to the fire promptly conducts to the temperature fuse 909 through the screw-fixing member 916 and the metal screw 908, where when the temperature of the temperature fuse 909 reaches a prescribed temperature, the temperature fuse 909 is melted to cut off the power output of the solar cell module.

The terminal box 901 Is provided with an easy-to-open-and-shut cap 911 and contains the temperature fuse 909 provided therein. Therefore, in the case of a solar cell array established using a plurality of solar cell modules having the configuration shown in FIGS. 9(A) and 9(B), there is an advantage in that when some of the solar cell modules in the solar cell array suffer from a spreading fire, for the surviving solar cell modules, by changing the temperature fuses provided in these solar cell modules to new ones, these solar cell modules can be reused.

In addition, because the temperature fuse 909 is thermally coupled with the steel sheet as the backside covering material 903 of the solar cell module through the metal screw 908 and the screw-fixing member 916 as previously described, thermal conduction between the temperature fuse 909 and the backside covering material 903 readily ensues.

In this connection, even when part of the solar cell modules in the solar cell array suffers from spreading fire when a fire occurs in the vicinity of the solar cell array, the heat radiated from the fire promptly conducts to all the solar cell modules to promptly cut off the power output of the solar cell modules.

Thus, according to this example, it is possible to attain a solar cell module and a solar cell array which are markedly ensured in terms of safety. In addition, the repair work can be efficiently executed.

EXAMPLE 3

Figure 10A:
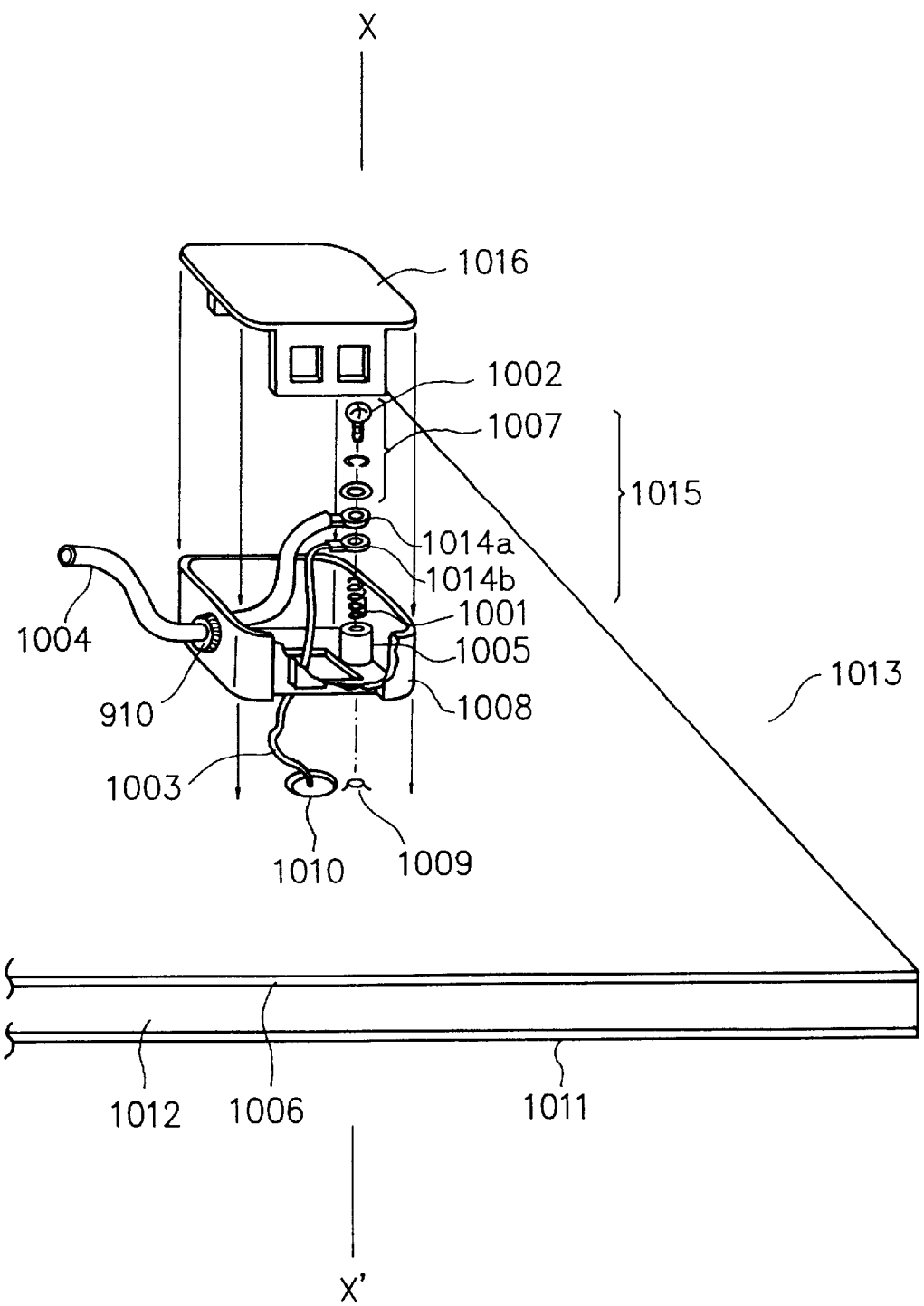
FIG. 10(A) is a schematic view illustrating another example of a terminal box used in a solar cell module according to the present invention.
Figure 10B:
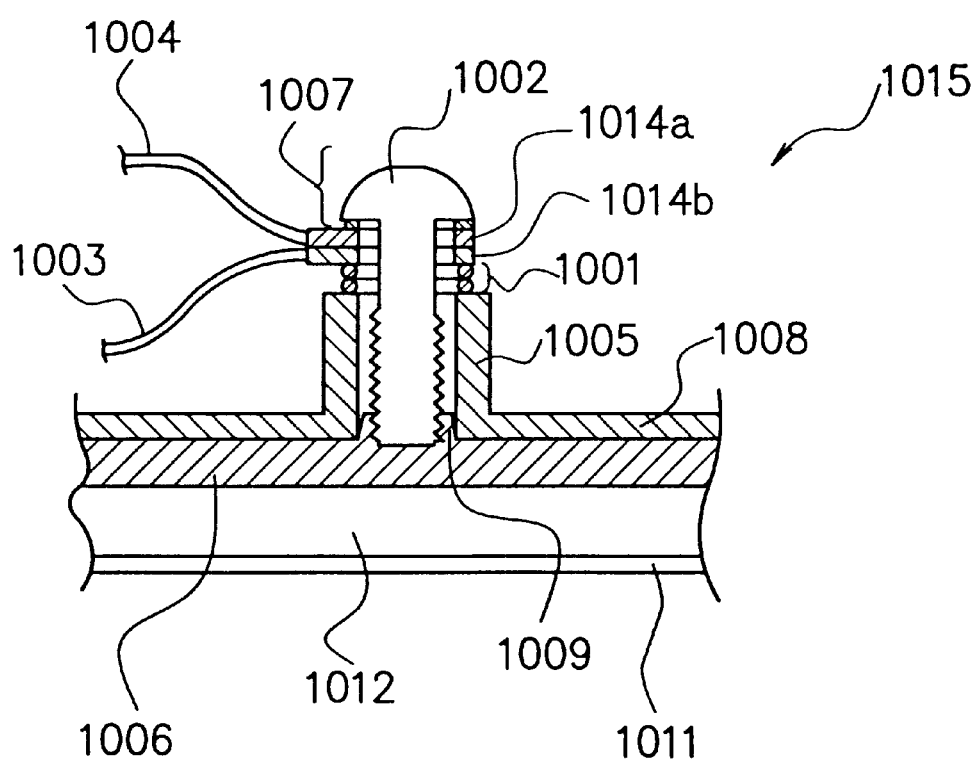
FIG. 10(B) is a schematic cross-sectional view, taken along the line X–X' in FIG. 10(A).

This example is based on FIGS. 10(A) and 10(B). In the following, description will be made with reference to FIGS. 10(A) and 10(B). FIG. 10(A) is a schematic view illustrating an example of a terminal box used in a solar cell module. FIG. 10(B) Is a schematic cross-sectional view, taken along the line X–X' in FIG. 10(A).

This example shows an embodiment in that a heat-sensitive circuit cut-off means comprising a heat-sensitive means and a circuit cut-off means is used in a solar cell module. In this embodiment, the heat-sensitive circuit cut-off means itself does not become a wiring path.

In FIGS. 10(A) and 10(B), reference numeral 1015 indicates a heat-sensitive circuit cut-off means comprising a heat-sensitive means and a circuit cut-off means, where the heat-sensitive means comprises a screw member 1002 made of nylon having a softening temperature of 220° C. and the circuit cut-off means comprises a spring member 1001 comprising a coiled spring.

Reference numeral 1003 indicates a power output lead, reference numeral 1004 a wiring cable, reference numeral 1005 a terminal board, reference numeral 1006 a backside covering material comprising a metal steel sheet, reference numeral 1007 a fastener, reference numeral 1008 a terminal box, reference numeral 1009 a screw-fixing hole, reference numeral 1010 an output power-outputting hole, reference numeral 1011 a surface side covering material comprising a fluororesin, reference numeral 1012 a filler in which a plurality of amorphous silicon (a-Si) solar cells (not shown) are enclosed, and reference numeral 1013a solar cell module Each of reference numerals 1014a and 1014b indicates a fastener.

The terminal box 1008 is fixed to the rear face of the backside covering material 1006 of the solar cell module 1013. The spring member 1001 and the fasteners 1014a and 1014b are fixed to the terminal board 1005 by means of the fastener 1007 comprising the screw member 1002. The screw member 1002 is fixed in the screw-fixing hole 1009 and it is contacted with the backside covering material 1006, where the spring member 1001 is fixed in a state that it is pressurized to be sufficiently shorter than the normal length.

Since the screw member 1002 is in contact with the backside covering material 1006 of the solar cell module 1013, thermal conduction between the backside covering material 1006 and the screw member 1002 readily ensues. This means that the backside covering material 1006 and the screw member 1002 are thermally coupled in a desirable state.

In the above-described constitution, when a fire is occurred in the vicinity of the solar cell module, heat radiated from a fire promptly conducts to the screw member 1002 through the backside covering material 1006. When the temperature of the screw member 1002 reaches the softening temperature of the resin as the constituent of the screw member, the screw member 1002 is deformed, where the screw member 1002 becomes incapable of fixing the screw member itself, the spring member 1001 and the like to the terminal board 1005. In this case, the spring member 1001 which has been fixed while being pressurized is released from the pressurized force to start returning to the normal length. By virtue of this force of returning to the normal length, the screw member 1002 slip off. Then, the wiring cable 1004 and the power output lead 1003 are separated one from the other due to their spring elasticities to cut off the mutual electric connection. In this way, the power output of the solar cell module 1013 is cut off.

In this example, instead of the screw member 1002 made of nylon, it is possible to use a screw member made of a shape memory alloy applied with insulating treatment having excellent thermal conductivity.

EXAMPLE 4

Figure 15A:
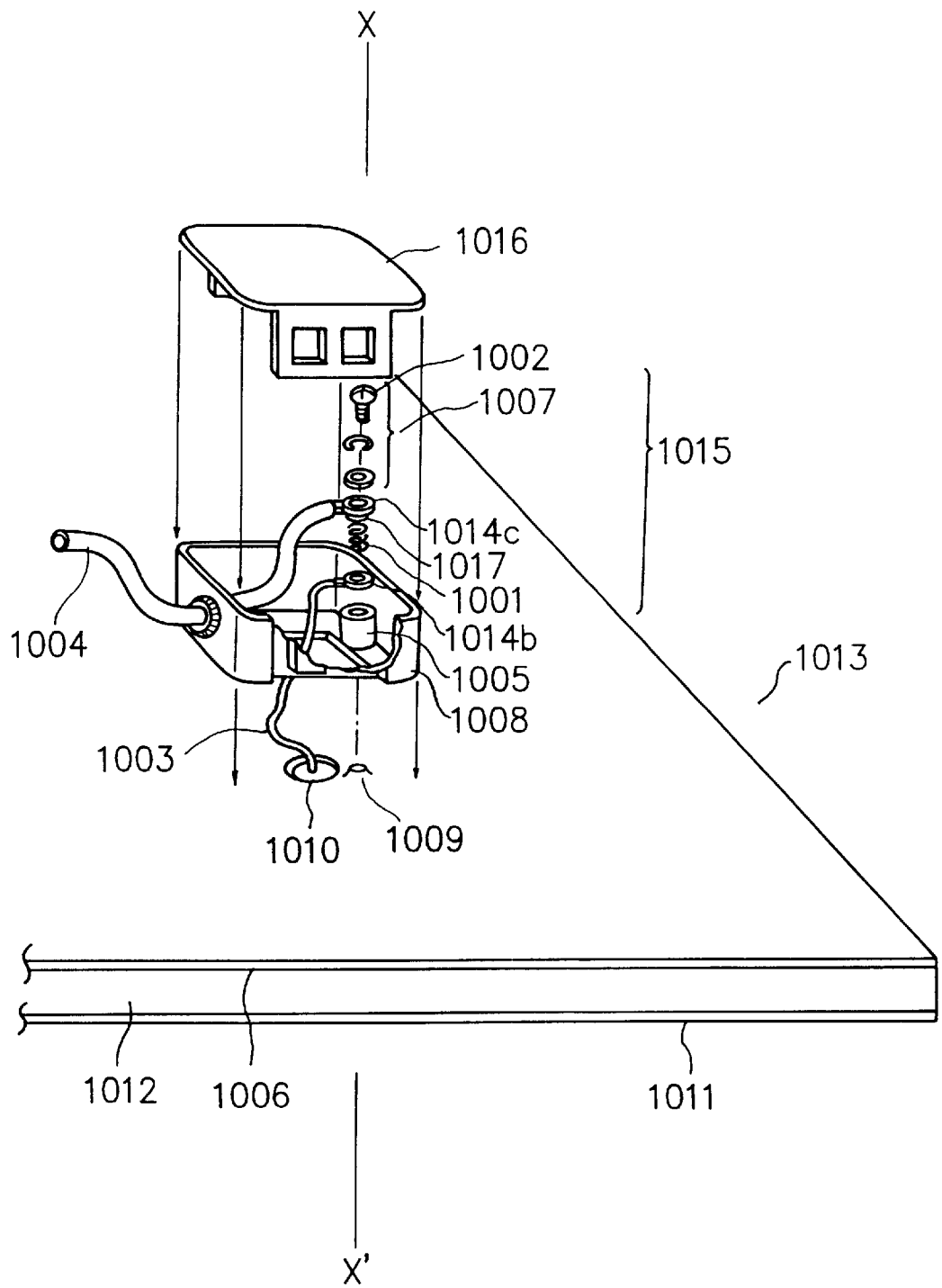
FIG. 15(A) is a schematic exploded view illustrating a further example of a heat-sensitive circuit cut-off means in the present invention.

This example is based on FIGS. 15(A) and 15(B). In the following, description will be made with reference to FIGS. 15(A) and 15(B). FIG. 15(A) is a schematic exploded view illustrating an example of a heat-sensitive circuit cut-off means used in a solar cell module. FIG. 15(B) is a schematic cross-sectional view of the heat-sensitive circuit cut-off means shown in FIG. 15(A), taken along the line X–X' in FIG. 15(A).

The embodiment shown in FIGS. 15(A) and 15(B) in this example differs from the embodiment shown in FIGS. 10(A) and 10(B) in Example 3 in that the spring member 1001 is arranged not between the fasteners (1014a and 1014b) and the terminal board 1005 as in Example 3 but between fasteners 1014c and 1014b as shown in FIGS. 15(A) and 15(B).

In the case where a fire is occurred in the vicinity of the solar cell module, when the screw member 1002 is softened due to heat radiated from the fire, the screw member 1002 slips off, whereby the wiring cable 1004 and the power output lead 1003 are separated one from the other due to their spring elasticities to cut off the continuity between the fasteners 1014c and 1014b. Further, in this example, the spring member 1001 is caught and held between the fasteners 1014c and 1014b and because of this, by virtue of the force of the spring member which intends to return to the normal length, the fasteners 1014c and 1014b are more surely separated one from the other thereby cutting off the continuity between them. Therefore, the electric connection between the wiring cable 1004 and the power output lead 1003 is more surely cut off.

Now, as well as in Example 3, since the backside covering material 1006 and the screw member 1002 are thermally coupled in a desirable state, the dynamic sensitivity of the heat-sensitive circuit cut-off means is very good.

In this example, it is more preferable that together with a fastener having a protrusion 1017 as such fastener 1014c, an insulative spring member made of, for instance, a ceramic is used as the spring member 1001. That is, except for the case where a fire occurs, by virtue of the protrusion 1017, the fasteners 1014c and 1014b can be more surely contacted to further ensure the electric connection between the wiring cable 1004 and the power output lead 1003. In the case where a fire occurs, after the fasteners 1014c and 1014b are separated, there is not a fear that electric connection will occur between the wiring cable 1004 and the power output lead 1003.

EXAMPLE 5

Figure 11A:
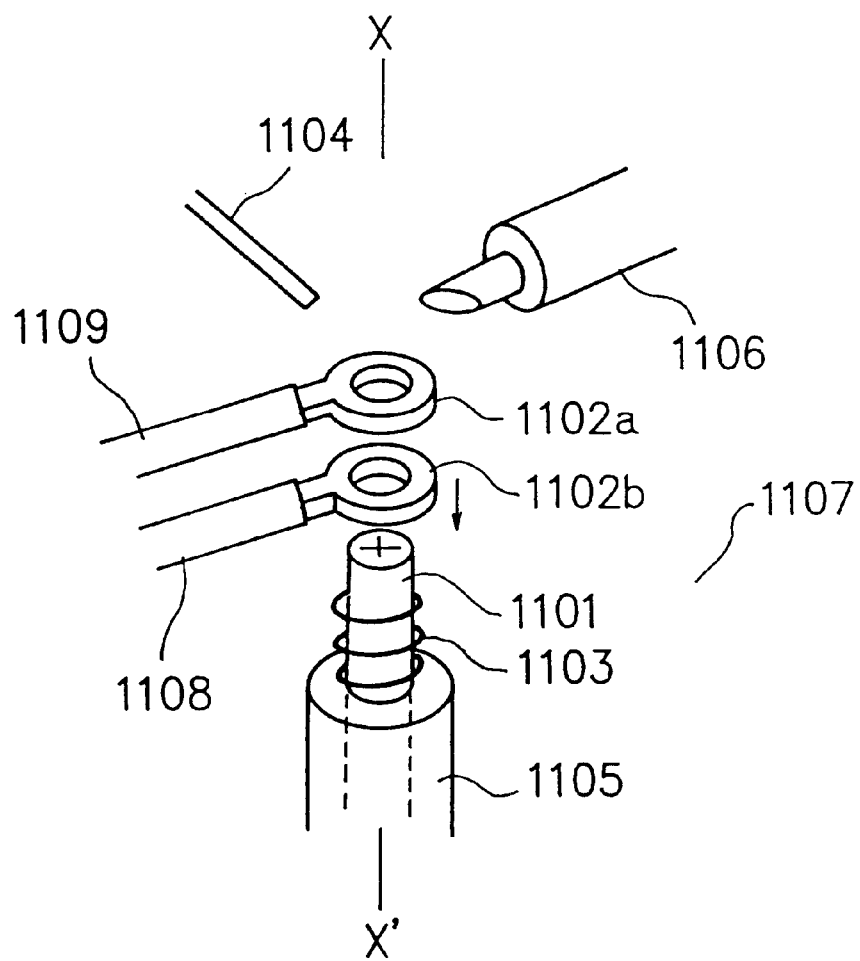
FIG. 11(A) is a schematic exploded view illustrating an example of a heat-sensitive circuit cut-off means in the present invention.

This example is based on FIGS. 11(A) and 11(B) In the following, description will be made with reference to FIGS. 11(A) and 11(B). FIG. 11(A) is a schematic exploded view illustrating an example of a heat-sensitive circuit cut-off means used in a solar cell module. FIG. 11(B) is a schematic cross-sectional view of the heat-sensitive circuit cut-off means shown in FIG. 11(A), taken along the line X–X' in FIG. 11(A). The heat-sensitive circuit cut-off means in this example comprises a heat-sensitive means and a circuit cut-off means, wherein the circuit cut-off means is fixed by the heat-sensitive means. As the heat-sensitive means, a solder 1104 is used, and as the circuit cut-off means, a spring member 1103 is used.

In FIGS. 11(A) and 11(B), reference numeral 1101 indicates a core member, each of reference numerals 1102a and 1102b a fastener, reference numeral 1105 a terminal board, reference numeral 1106 a soldering iron, reference numeral 1107 a heat-sensitive circuit cut-off means, reference numeral 1108 a power output lead, reference numeral 1109 a wiring cable, and reference numeral 1111 an insulating member. In FIG. 11(B), reference numeral 1100 indicates a solar cell module, reference numeral 1101 a surface side covering member, reference numeral 1102 a filler in which a plurality of amorphous silicon (a-Si) solar cells (not shown) are enclosed, and reference numeral 1006 a backside covering material.

The core member 1101 is desired to comprise a highly thermal-conductive material excelling in solder-wetting. In this example, the core member 1101 comprises a copper alloy.

The core member 1101 is fixed to the terminal board 1105. In addition, the spring member 1103, the fastener 1102b, and the fastener 1102a are fixed in this order to the terminal board 1105 by means of the solder 1104, where the spring member 1103 is fixed in a state that it is pressurized to be shorter than the normal length.

The terminal board 1105 is fixed to the rear face of the backside covering material 1006 of the solar cell module 1100 in a state that the terminal board 1105 is electrically isolated from the backside covering material 1006 (comprising a coated steel sheet).

The insulating member 1111 is provided so as to electrically insulate between the core member 1101 and the back side covering material 1006 of the solar cell module 1100. The insulating member 1111 comprises a highly thermal-conductive ceramic plate whose thermal conductivity is 60 W/m·k.

Now, since the core member 1101 comprises the copper alloy, the core member is highly thermal-conductive. Thus, thermal conduction from the backside covering material 1006 to the solder 1104 as the heat-sensitive means is very good. This means that the backside covering material 1006 and the heat-sensitive means 1104 are thermally coupled in a desirable state.

Consequently, the heat-sensitive circuit cut-off means 1107 in this example has a very high dynamic sensitivity. Particularly, when a fire occurs in the vicinity of the solar cell module and the solder 1104 as the heat-sensitive means fixing the fasteners 1102a and 1102b is softened due to heat radiated from the fire, by virtue of the force of the spring member 1103 which intends to return to the normal length, the wiring cable 1109 and the power output lead 1108 are jumped and they slip off from the core member 1101. Then, the wiring cable 1109 and the power output lead 1108 are separated one from the other due to their spring elasticities, whereby the continuity between them is cut off.

In this example, it is possible that the core lead of the wiring cable 1109 and the power output lead 1108 are fixed to the core member 1101 by means of the solder 1104, without using the fasteners 1102a and 1102b.

EXAMPLE 6

Figure 12A:
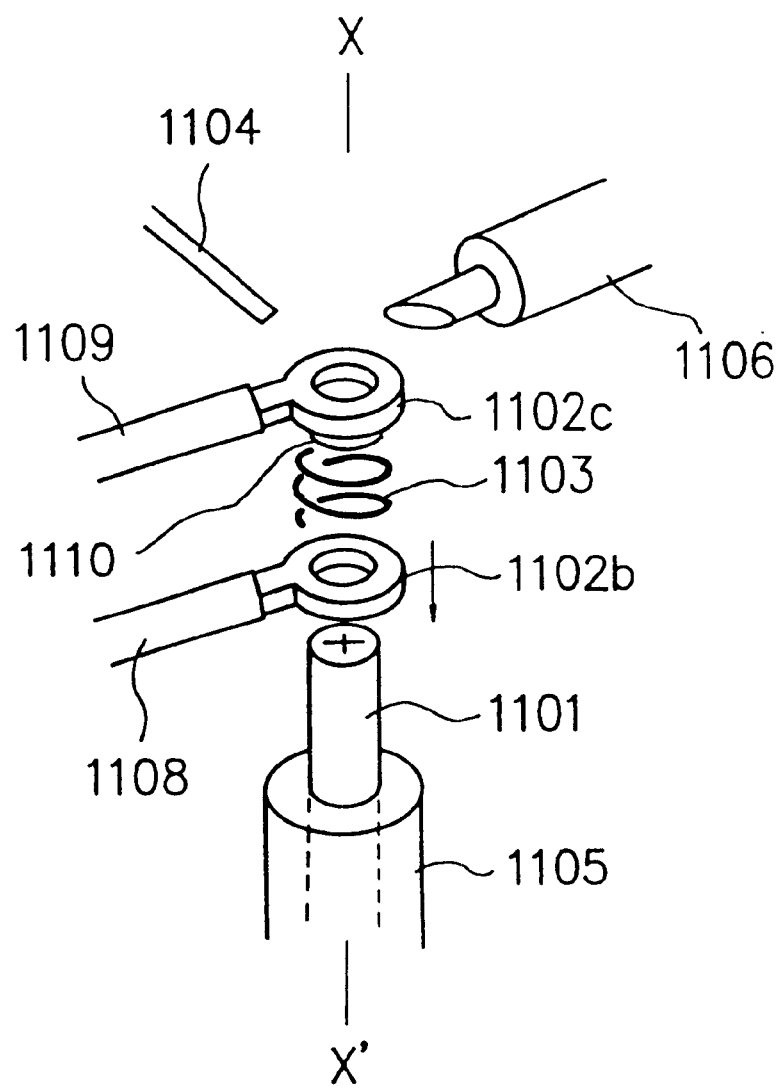
FIG. 12(A) is a schematic exploded view illustrating another example of a heat-sensitive circuit cut-off means in the present invention.
Figure 12B:
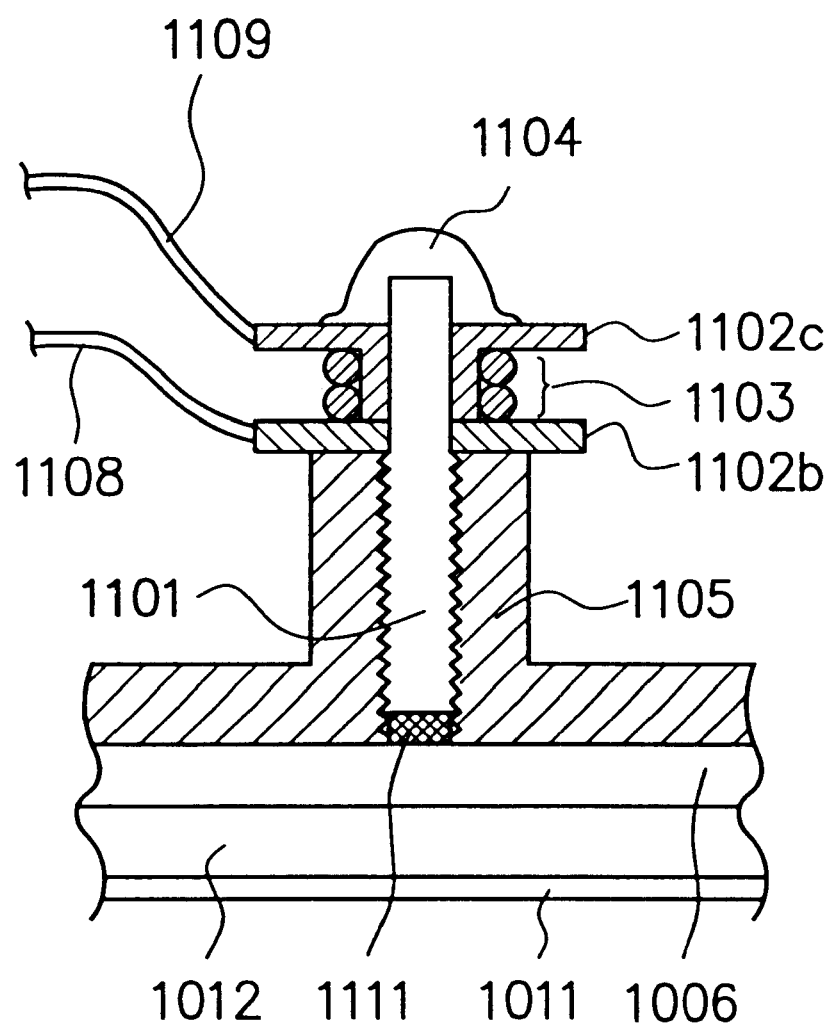
FIG. 12(B) is a schematic cross-sectional view of the heat-sensitive circuit cut-off means shown in FIG. 12(A), taken along the line X–X' in FIG. 12(A).

This example is based on FIGS. 12(A) and 12(B). In the following, description will be made with reference to FIGS. 12(A) and 12(B). FIG. 12(A) is a schematic exploded view illustrating an example of a heat-sensitive circuit cut-off means used in a solar cell module. FIG. 12(B) is a schematic cross-sectional view of the heat-sensitive circuit cut-off means shown in FIG. 12(A) taken along the line X–X' in FIG. 12(A).

The embodiment shown in FIGS. 12(A) and 12(B) in this example differs from the embodiment shown in FIGS. 11(A) and 11(B) in Example 5 with the point that the spring member 1103 is arranged not between the fasteners (1102c and 1102b) and the terminal board 1105 as in Example 5 but between fasteners 1102c and 1102b as shown in FIGS. 12(A) and 12(B).

In the embodiment of this example, when a fire occurs in the vicinity of the solar cell module and the solder 1104 as the heat-sensitive means is softened due to heat radiated from the fire, by virtue of the force of the spring member 1103 which intends to return to the normal length, the wiring cable 1109 and the power output lead 1108 are jumped and they slip off from the core member 1101. Then, the wiring cable 1109 and the power output lead 1108 are separated one from the other due to their spring elasticities, whereby the continuity between the fasteners 1102c and 1102b is cut off.

Further, in this example, the spring member 1103 is caught and held between the fasteners 1102c and 1102b and because of this, by virtue of the force of the spring member 1103 which intends to return to the normal length, the fasteners 1102c and 1102b are more surely separated one from the other thereby cutting off the continuity between them. Therefore, the electric connection between the wiring cable 1109 and the power output lead 1108 is more surely cut off.

In this example, it is more preferable that together with a fastener having a protrusion 1110 as such fastener 1102c, an insulative spring member made of, for instance, a ceramic is used as the spring member 1103. That is, except for the case where a fire occurs, by virtue of the protrusion 1110, the fasteners 1102c and 1102b can be more surely contacted to further ensure the electric connection between the wiring cable 1109 and the power output lead 1108. In the case where a fire occurs, after the fasteners 1102c and 1102b are separated, there is not a fear that electric connection will occur between the wiring cable 1109 and the power output lead 1108.

Separately, in each of Examples 5 and 6, instead of using the ceramic plate as the insulating member, it is possible to use a glass chip. Also in this case, the core material and the backside covering material of the solar cell module are desirably thermally coupled.

Now, for instance, in the case where a temperature fuse is used as the heat-sensitive circuit cut-off means, there is an occasion that the temperature fuse itself becomes a part of the current-flowing path, there by resulting in a loss in electric power. However, according to the embodiment described in each of Examples 3 to 6 in which the heat-sensitive circuit cut-off means has a functionally divided structure comprising a heat-sensitive means and a circuit cut-off means, it is not necessary to energize the heat-sensitive circuit cut-off means itself. Thus, it is possible to prevent the occurrence of such a loss in electric power. In addition, in this case, it is not necessary to use an electrically conductive material as the constituent of the heat-sensitive circuit cut-off means. This situation improves freedom for material selection.

EXAMPLE 7

Figure 16A:
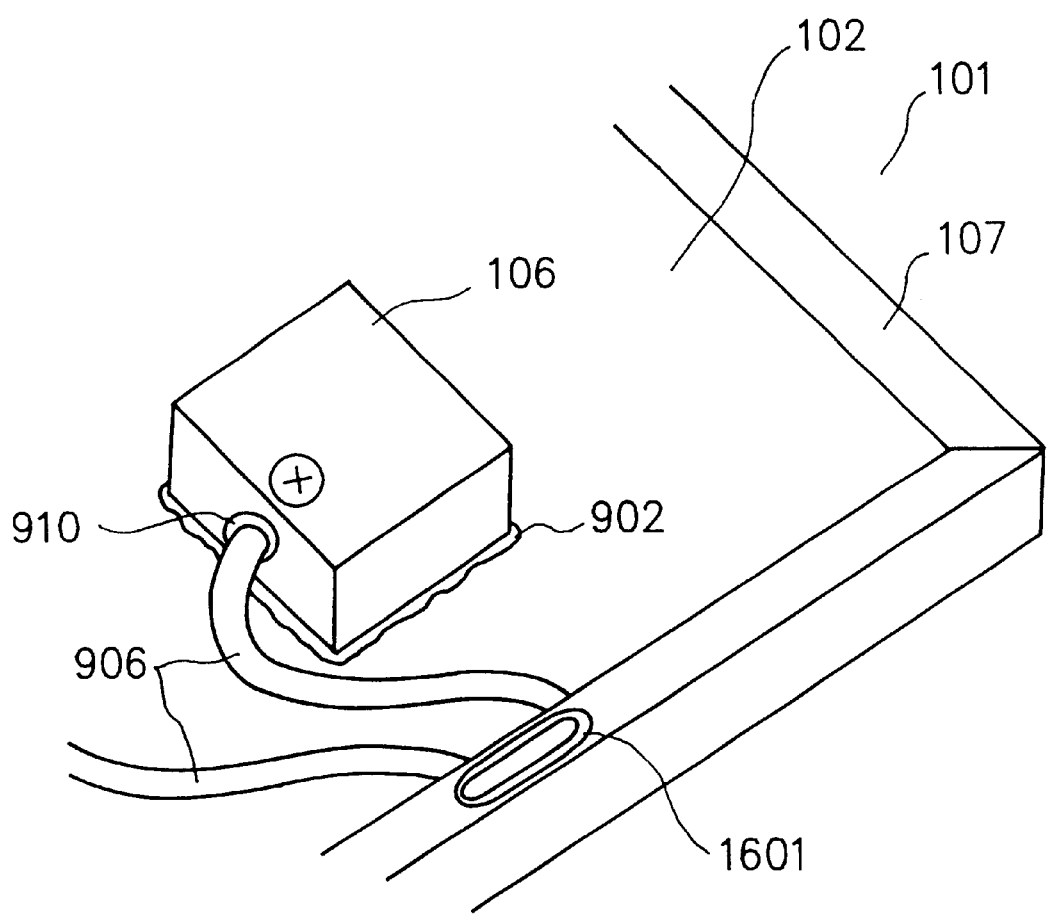
FIG. 16(A) is a schematic view illustrating a example of a location where a heat-sensitive circuit cut-off means in the present invention is installed.
Figure 16B:
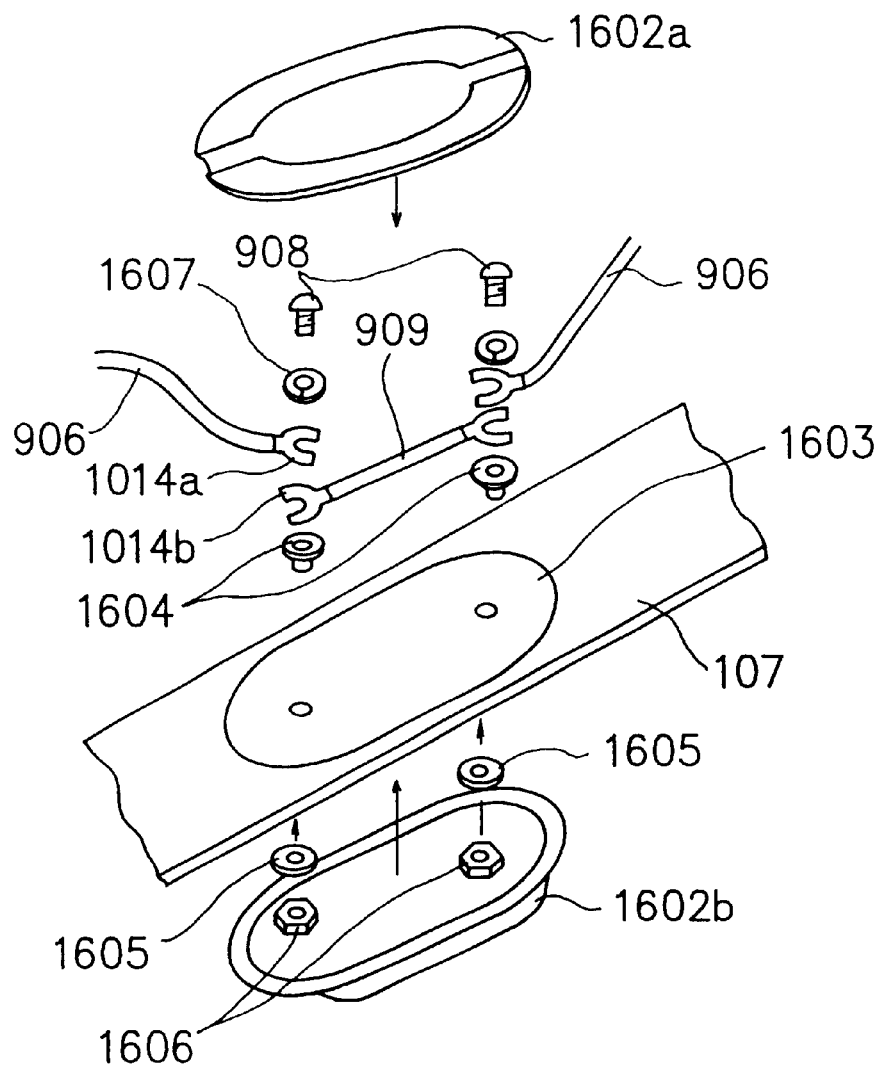
FIG. 16(B) is a schematic exploded view illustrating an example of a heat-sensitive circuit cut-off means used as the heat-sensitive circuit cut-off means shown in FIG. 16(A).

This example is based on FIGS. 16(A) and 16(B). In the following, description will be made with reference to FIGS. 16(A) and 16(B). FIG. 16(A) shows an embodiment in that in a solar cell module 101 having a frame body 107 (this solar cell module having such configuration as shown in FIG. 1), a heat-sensitive circuit cut-off means having a temperature fuse box 1601 is provided at the frame body 107. The frame body 107 comprises an aluminum frame. FIG. 16(B) shows an example of the internal structure of aforesaid heat-sensitive circuit cut-off means.

In FIG. 16(A), reference numeral 102 indicates a backside covering member of the solar cell module, reference numeral 106 a terminal box provided on the rear face of the back side covering member 102, reference numeral 902 a sealing material, reference numeral 906 a wiring cable, and reference numeral 910 a waterproof bush.

In FIG. 16(B), reference numeral 908 indicates a metal screw, reference numeral 909 a heat-sensitive circuit cut-off means, reference numeral 1602a indicates a top cap for the temperature fuse box 1601, reference numeral 1602b a bottom cap for the temperature fuse box 1601, reference numeral 1603 a 500 μm thick film made of polyethylene glycol terephthalate (trademark; MYLAR, produced by Du Pont Company), reference numeral 1604 a ceramic cap, reference numeral 1605 a ceramic washer, reference numeral 1606 a nat, and reference numeral 1607 a washer. The heat-sensitive circuit cut-off means 909 comprises a temperature fuse whose breaking temperature is 200° C.

The wiring cable 906 extending from the terminal box 106 is introduced into the temperature fuse box 1601 through one end portion thereof, and it is drawn out from the temperature fuse box through the other end portion thereof. The temperature fuse 909 is fixed to the frame body 107 through the ceramic cap 1604 and the MYLAR film 1603, where the temperature fuse 909 is fixed to the frame body 107 by means of the metal screw 908. The heat-sensitive circuit cut-off means comprising the temperature fuse 909 is covered by the top cap 1602a and the bottom cap 1602b, and internal space of the temperature fuse box 1601 is water-tightened by means of a sealing material (not shown).

The ceramic cap 1604 comprises a highly thermal-conductive ceramic material whose thermal conductivity is 50 W/m·K. The ceramic cap 1604 and the MYLAR film 1603 are electrically insulative, and therefore, the temperature fuse 909 is electrically isolated from the frame body 107.

In addition, the ceramic cap 1604 and the MYLAR film 1603 are highly thermal-conductive and because of this, thermal conduction from the frame body 107 to the temperature fuse 909 through the ceramic cap 1604 and the MYLAR film 1603 efficiently ensues. This means that the temperature fuse 909 and the frame body 107 are thermally coupled in a desirable state. Thus, the heat-sensitive circuit cut-off means comprising the temperature fuse 909 has good dynamic sensitivity.

When a fire is occurs in the vicinity of the solar cell module 101 and heat radiated from the fire is imparted to the frame body of the solar cell module, the heat of the frame body promptly conducts to the heat-sensitive circuit cut-off means comprising the temperature fuse 909, where when the temperature of the temperature fuse 909 reaches a prescribed temperature, the temperature fuse 909 is broken to cut off the power output of the solar cell module.

In this example, it is possible to employ the configuration of any of the heat-sensitive circuit cut-off means described in Examples 3 to 7. In that case, thermal coupling of the heat-sensitive circuit cut-off means and the frame body may be performed in accordance with the manner described in any of these examples.

Separately, in the case where a plurality of solar cell modules having any of the heat-sensitive circuit cut-off means described in Examples 2 to 7 are arranged while being electrically connected with each other, for each adjacent solar cell modules, their frame bodies and backside covering materials are usually in contact with each other. Therefore, when a fire occurs in the vicinity of the arrangement of the solar cell modules and one of the solar cell modules suffers from heat radiated from the fire, the heat possessed by said solar cell module promptly conducts through its frame body and backside covering material to the remaining solar cell modules. In this case, since any of the heat-sensitive circuit cut-off means described in Examples 2 to 7 is thermally coupled with the backside covering material or the frame body of the solar cell module, even when one of the solar cell modules suffers from the heat radiated from the fire as above-described, the heat possessed by said solar cell module promptly conducts the heat-sensitive circuit cut-off means of the remaining solar cell modules, whereby the power output of each of the solar cell modules is cut off. Thus, safety is ensured.

EXAMPLE 8

Figure 13:
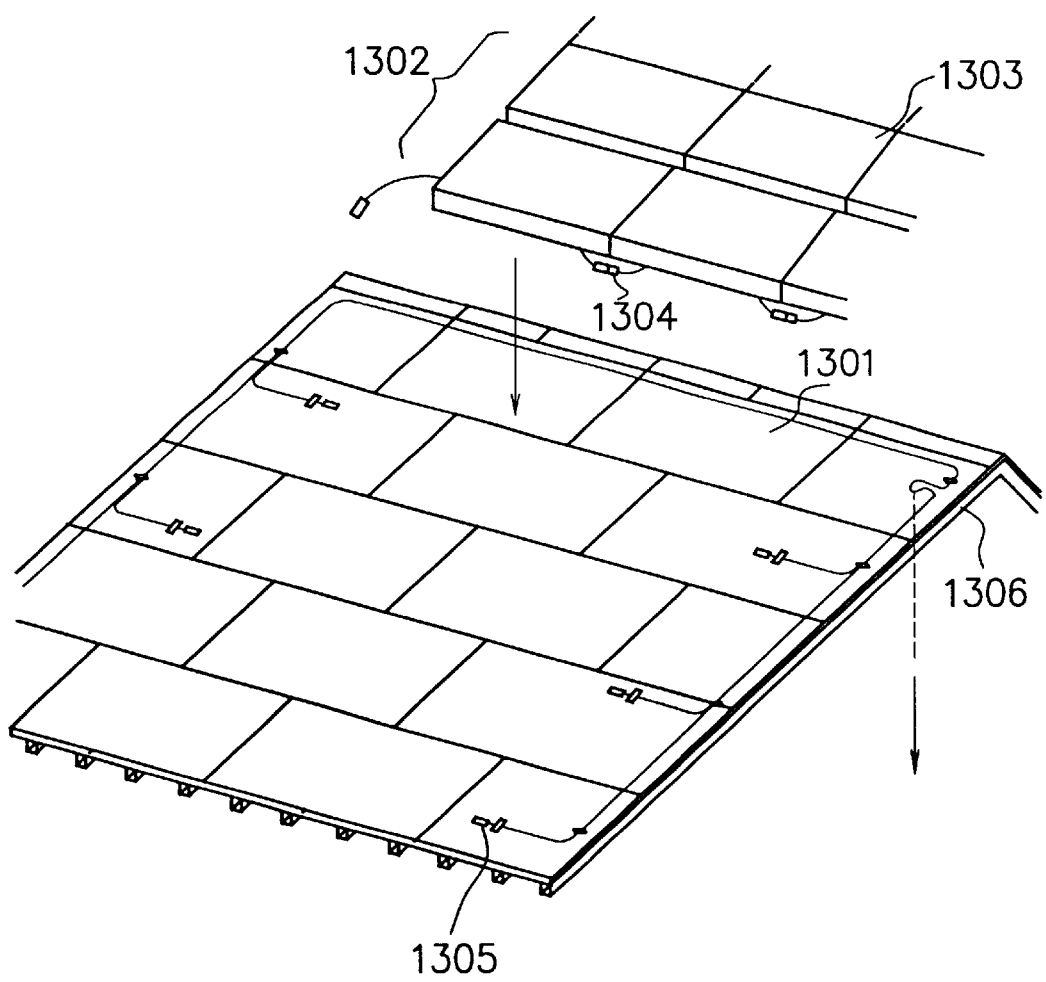
FIG. 13 is a schematic plan view illustrating another example of a solar cell array according to the present invention.

This example is based on FIGS. 13 and 14. In the following, description will be made with reference to FIGS. 13 and 14. FIG. 13 is a schematic plan view illustrating an example of a solar cell array. FIG. 14 is a schematic view illustrating an example of a trunk connector used in the solar cell array shown in FIG. 13.

First, description will be made with reference to FIG. 13. FIG. 13 shows an embodiment in that a flameproof metal roof plate 1301 is laid on a roof of a wooden building and a solar cell array 1302 comprising a plurality of roof-Integral type solar cell modules 1303 is installed thereon, wherein adjacent roof-integral type solar cell modules 1303 are electrically connected by means of a coupling type connector 1304.

Each roof-integral type solar cell module 1303 comprises a rectangular step-roofing type solar cell module containing a plurality of polycrystalline series solar cells arranged therein and having a surface covering member made of glass and a backside covering member comprising a ceramic plate.

The metal roof plate 1301 has a plurality of trunk connectors 1305 provided prior to the installation of the solar cell array 1302. Each trunk connector 1305 corresponds to one of the solar cell module strings constituting the solar cell array 1302, where wiring cables extending from the solar cell module string are gathered in the trunk connector 1305. Each trunk connector 1305 has a heat-sensitive circuit cut-off means provided therein. The heat-sensitive circuit cut-off means comprises a temperature fuse whose breaking temperature is 183° C.

The wiring cables from the trunk connectors 1305 are wired into the building through a communication hole 1306, where they are electrically connected to an interior wiring system including an inverter (not shown).

FIG. 14 is an enlarged view showing the structure of the above-described trunk connector 1305. As shown in FIG. 14, the temperature fuse 1403 as the heat-sensitive circuit cut-off means is fixed to a terminal board 1404 by means of fixing vises 1402 made of ceramic, where the temperature fuse 1403 is thermally coupled with the metal roof plate 1401 through the fixing vises 1402. Reference numeral 1405 indicates a cap, and each of reference numerals 1406a and 1406b a wiring cable.

According to this example, in the case where a fire occurs in the vicinity of the building, even when part of the solar cell modules 1303 of the solar cell array 1302 suffers from spreading fire, since the metal roof plate is laid on the entire roof of the building, the heat radiated from those solar cell modules suffered from the spreading fire promptly conducts to the metal roof plate 1301 on which the solar cell array 1302 is arranged, followed by promptly conducting to the temperature fuses 1403, whereby the temperature fuses are broken to surely cut off the power output of the solar cell modules. Thus, the constitution of this example is always ensured in terms of safety of the solar cell array. In the repair work, it is sufficient to check only the trunk connectors 1305, and, therefore, the repair work can be efficiently executed.

Separately, in this example, it is possible for the above heat-sensitive circuit cut-off means to be replaced by any of the heat-sensitive circuit cut-off means described in Examples 3 to 6. In that case, said heat-sensitive circuit cut-off means is thermally coupled not with the backside covering material of the solar cell module, but with the installation face of the roof. That is, the arrangement of any of the heat-sensitive circuit cut-off means described in Examples 3 to 6 is designed so that thermal conduction between the heat-sensitive circuit cut-off means and the installation face readily ensues with reference to the manner described in these examples.

As being understood from the above description, the present invention provides such advantages as follows. By arranging the heat-sensitive circuit cut-off means according to the present invention in a solar cell module or a solar cell array, in the case where a fire occurs and the solar cell module or the solar cell array suffers from spreading fire, the heat-sensitive circuit cut-off means promptly cuts off the electric connection involved even at a temperature which is lower than the temperature at which the solar cell provided in the solar cell module is deteriorated to lose power generation function. Because of this, even when the surviving solar cell modules in the solar cell array still generate electricity after the completion of the fire-extinguishing, since the electric wirings among the solar cell modules are disconnected, no high voltage is present at the wiring cables of the solar cell array. Thus, extremely high safety is ensured. This situation enables the repair work to efficiently proceed. In addition, the solar cell modules are prevented from causing leakage and because of this, secondary accidents such as fire due to the leakage are prevented from occurring.

What is claimed is:

1. A solar cell module comprising:

a plurality of solar cells enclosed therein;

an electric wiring member electrically connected to said solar cells;

a heat-sensitive circuit cut-off means which cuts an electric connection between said solar cells and said electric wiring member when heat with a temperature which is higher than a breaking temperature of said heat-sensitive circuit cut-off means is applied on said heat-sensitive circuit cut-off means;

a backside covering material on a non-light receiving side of said solar cell module; and at least a member selected from the group consisting of a frame body, a terminal box and an electrically connecting connector at a periphery of said solar cell module;

wherein said electric wiring member is capable of being maintained in an electrically cut-off state after said electric connection is cut; and wherein at least one of said backside covering material and said member is provided with said heat-sensitive circuit cut-off means.

2. The solar cell module according to claim 1, wherein the breaking temperature of said heat-sensitive circuit cut-off means is higher than 150° C. and lower than a temperature at which the solar cells lose power generation function.

3. The solar cell module according to claim 1, wherein said solar cell module has a highly thermal-conductive member as a constituent thereof, and the heat-sensitive circuit cut-off means is arranged in close proximity to said highly thermal-conductive member.

4. The solar cell module according to claim 3, wherein the heat-sensitive circuit cut-off means is arranged in contact with the highly thermal-conductive member through an electrically insulating member.

5. The solar cell module according to claim 1, wherein said solar cell module has a highly thermal-conductive member as a constituent thereof, and the heat-sensitive circuit cut-off means is arranged such that the heat-sensitive circuit cut-off means is thermally coupled with said thermal-conductive member.

6. The solar cell module according to claim 1, wherein the heat-sensitive circuit cut-off means has a member selected from the group consisting of a temperature fuse, a brazing metal, a shape memory alloy and combinations thereof.

7. The solar cell module according to claim 6, wherein the brazing metal is a solder.

8. A solar cell module comprising:

a plurality of solar cells enclosed therein, an electric wiring member electrically connected to said solar cells;

a heat-sensitive circuit cut-off means which has a functionally divided structure comprising a heat-sensitive means and a circuit cut-off means and which cuts an electric connection between said solar cells and said electric wiring member when heat with a temperature which is higher than a breaking temperature of said heat-sensitive circuit cut-off means is applied on said heat-sensitive circuit cut-off means;

a backside covering material on a non-light receiving side of said solar cell module; and at least a member selected from the group consisting of a frame body, a terminal box and an electrically connecting connector at a periphery of said solar cell module;

wherein said electric wiring member is capable of being maintained in an electrically cut-off state after said electric connection is cut; and wherein at least one of said backside covering material and said member is provided with said heat-sensitive circuit cut-off means.

9. The solar cell module according to claim 8, wherein the breaking temperature of said heat-sensitive circuit cut-off means is higher than 150° C. and lower than a temperature at which the solar cells lose power generation function.

10. The solar cell module according to claim 8, wherein said solar cell module has a highly thermal-conductive member as a constituent thereof, and at least the heat-sensitive circuit cut-off means is arranged in close proximity to said highly thermal-conductive member.

11. The solar cell module according to claim 10, wherein at least the heat-sensitive circuit cut-off means is arranged in contact with the highly thermal-conductive member through an electrically insulating member.

12. The solar cell module according to claim 8, wherein said solar cell module has a highly thermal-conductive member as a constituent thereof, and at least the heat-sensitive circuit cut-off means is arranged such that the heat-sensitive circuit cut-off means is thermally coupled with said thermal-conductive member.

13. The solar cell module according to claim 8, wherein the heat-sensitive circuit cut-off means has a member selected from the group consisting of a temperature fuse, a brazing metal, a shape memory alloy, a resin, and combinations thereof.

14. The solar cell module according to claim 13, wherein the brazing metal is a solder.

15. The solar cell module according to claim 8, wherein the heat-sensitive circuit cut-off means comprises an elastic body or a shape memory alloy.

16. The solar cell module according to claim 15, wherein the elastic body comprises a coiled spring or a blade spring.

17. A solar cell array comprising a plurality of solar cell modules electrically connected with each other by means of an electric connection means having an electric wiring member, each of said plurality of solar cell modules comprising:

a plurality of solar cells enclosed therein, said solar cells being connected to said electric wiring member; and a heat-sensitive circuit cut-off means which cuts off said electric connection means when heat with a temperature which is higher than a breaking temperature of said heat-sensitive circuit cut-off means is applied on said heat-sensitive circuit cut-off means;

wherein said electric wiring member is capable of being maintained in an electrically cut-off state after said electric connection means is cut off.

18. The solar cell array according to claim 17, wherein the breaking temperature of said heat-sensitive circuit cut-off means is higher than 150° C. and lower than a temperature at which the solar cells lose power generation function.

19. The solar cell array according to claim 17, wherein the heat-sensitive circuit cut-off means is arranged in close proximity to a highly thermal-conductive member.

20. The solar cell array according to claim 19, wherein the heat-sensitive circuit cut-off means is arranged in contact with the highly thermal-conductive member through an electrically insulating member.

21. The solar cell array according to claim 19, wherein the thermal-conductive member is an installation face on which said solar cell array is arranged.

22. The solar cell array according to claim 17, wherein the heat-sensitive circuit cut-off means is arranged such that the heat-sensitive circuit cut-off means is thermally coupled with a highly thermal-conductive member.

23. The solar cell array according to claim 22, wherein the thermal-conductive member is an installation face on which said solar cell array is arranged.

24. The solar cell array according to claim 17, wherein each of the solar cell modules has a backside covering material on a non-light receiving face side thereof, and the backside covering material of (a) one of the solar cell modules is contacted with the backside covering material of (b) another solar cell module adjacent to said solar cell module (a).

25. The solar cell array according to claim 17, wherein each of the solar cell modules has a frame body to circumscribe at least part of the periphery thereof, and the frame body of (a) one of the solar cell modules is contacted with the frame body of (b) another solar cell module adjacent to said solar cell module (a).

26. The solar cell array according to claim 17, wherein the heat-sensitive circuit cut-off means has a member selected from the group consisting of a temperature fuse, a brazing metal, a shape memory alloy and combinations thereof.

27. The solar cell array according to claim 26, wherein the brazing metal is a solder.

28. A solar cell array comprising a plurality of solar cell modules electrically connected with each other by means of an electric connection means having an electric wiring member, each of said plurality of solar cell modules comprising:

a plurality of solar cells enclosed therein, said solar cells being connected to said electric wiring member; and a heat-sensitive circuit cut-off means which has a functionally divided structure comprising a heat-sensitive means and a circuit cut-off means and which cuts off said electric connection means when heat with a temperature which is higher than a breaking temperature of said heat-sensitive circuit cut-off means is applied on said heat-sensitive circuit cut-off means;

wherein said electric wiring member is capable of being maintained in an electrically cut-off state after said electric connection means is cut off.

29. The solar cell array according to claim 28, wherein the breaking temperature of said heat-sensitive circuit cut-off means is higher than 150° C. and lower than a temperature at which the solar cells lose power generation function.

30. The solar cell array according to claim 28, wherein at least the heat-sensitive circuit cut-off means is arranged in close proximity to a highly thermal-conductive member.

31. The solar cell array according to claim 30, wherein at least the heat-sensitive circuit cut-off means is arranged in contact with the highly thermal-conductive member through an electrically insulating member.

32. The solar cell array according to claim 30, wherein the thermal-conductive member is an installation face on which said solar cell array is arranged.

33. The solar cell array according to claim 28, wherein at least the heat-sensitive circuit cut-off means is arranged such that the heat-sensitive circuit cut-off means is thermally coupled with a highly thermal-conductive member.

34. The solar cell array according to claim 33, wherein the thermal-conductive member is an installation face on which said solar cell array is arranged.

35. The solar cell array according to claim 28, wherein each of the solar cell modules has a backside covering material on a non-light receiving face side thereof, and the backside covering material of (a) one of the solar cell modules is contacted with the backside covering material of (b) another solar cell module adjacent to said solar cell module (a).

36. The solar cell array according to claim 28, wherein each of the solar cell modules has a frame body to circumscribe at least part of the periphery thereof, and the frame body of (a) one of the solar cell modules is contacted with the frame body of (b) another solar cell module adjacent to said solar cell module (a).

37. The solar cell array according to claim 28, wherein the heat-sensitive circuit cut-off means has a member selected from the group consisting of a temperature fuse, a brazing metal, a shape memory alloy, a resin, and combinations thereof.

38. The solar cell array according to claim 37, wherein the brazing metal is a solder.

39. The solar cell array according to claim 28, wherein the heat-sensitive circuit cut-off means comprises an elastic body or a shape memory alloy.

40. The solar cell array according to claim 39, wherein the elastic body comprises a coiled spring or a blade spring.

41. A solar cell module comprising:

a plurality of solar cells; and an electric wiring member which is connected to said solar cells and which has at least one connection portion;

wherein an end portion of said electric wiring member, another end portion of said electric wiring member and an elastic body are fixed at said connection portion by means of a fixing member, and wherein said elastic body is deformed by way of elastic deformation.

42. The solar cell module according to claim 41, wherein the softening temperature of said fixing member is higher than 150° C. and lower than a temperature at which the solar cells lose power generation function.

43. The solar cell module according to claim 41, wherein the elastic body is arranged between said one end portion of said electric wiring member and said another end portion of said electric wiring member.

44. The solar cell module according to claim 41, wherein said solar cell module has a frame body or a backside covering material on a non-light receiving face side thereof, wherein said one end portion of said electric wiring member, said another end portion of said electric wiring member and said elastic body are caught and held by said fixing member and said frame body or said backside covering material, wherein said fixing member is electrically insulative, and wherein said fixing member is in contact with said frame body or said backside covering material.

45. The solar cell module according to claim 42, wherein said fixing member comprises a resin or a glass solder.

46. The solar cell module according to claim 41, wherein said solar cell module has a frame body or a backside covering material on a non-light receiving face side thereof, wherein said one end portion of said electric wiring member, said another end portion of said electric wiring member and said elastic body are caught and held by said fixing member and said frame body or said backside covering material, and wherein an electrically insulative member is arranged between said fixing member and said frame body or said backside covering material to electrically isolate said fixing member from said frame body or said backside covering material.

47. The solar cell module according to claim 46, wherein said electrically insulative member comprises a material selected from the group consisting of a ceramic, a glass, a resin and a metal applied with insulating treatment.

48. A solar cell module comprising:

a plurality of solar cells; and an electric wiring member which is connected to said solar cells, characterized in that said electric wiring member has at least one connection portion, and one end portion of said electric wiring member and the other end portion of said electric wiring member are electrically connected at said connection portion through a heat-sensitive member.

49. The solar cell module according to claim 48, wherein the fusing temperature of said heat-sensitive member is higher than 150° C. and lower than a temperature at which the solar cells lose power generation function.

50. The solar cell module according to claim 48, wherein said heat-sensitive member comprises a temperature fuse or a brazing metal.

51. The solar cell module according to claim 48, wherein said brazing metal is a solder.

52. A sunlight power generation apparatus which comprises a solar cell array comprising a plurality of solar cell module strings having an electric wiring means electrically connected with each other in parallel connection through said electric wiring means, each of said plurality of solar cell module strings comprising a plurality of solar cell modules electrically connected with each other in series connection, said solar cell array having a power output portion which is electrically connected to an inverter, characterized in that said electric wiring means is provided with a heat-sensitive circuit cut-off means or a heat-sensitive circuit cut-off means having a functionally divided structure comprising a heat-sensitive means and a circuit cut-off means.

* * * * *

UNITED STATES PATENT AND TRADEMARK OFFICE
CERTIFICATE OF CORRECTION

PATENT NO. : 6,307,144 B1
DATED : October 23, 2001
INVENTOR(S) : Toshihiko Miura et al.

It is certified that error appears in the above-identified patent and that said Letters Patent is hereby corrected as shown below:

Title page,
Item [57], ABSTRACT, line 8, "is," should read -- is --.

Column 2,
Line 54, "ouch" should read -- such --.

Column 4,
Line 4, "strings" should read -- strings, --; and
Line 45, "view" should read -- view, --.

Column 6,
Line 11, "invasion" should read -- invasion. --.

Column 9,
Line 30, "Is" should read -- is --;
Line 59, "to be" should be deleted; and
Line 61, "to be" should be deleted.

Column 10,
Line 57, "to" should be deleted; and
Line 61, "furthermore" should read -- further --.

Column 11,
Line 36, "tions" should read -- tion, --.

Column 12,
Line 26, "string" should read -- strings --.

Column 13,
Line 28, "Is" should read -- is --; and
Line 31, "103" should read -- 403 --.

Column 14,
Line 4, "CVD a" should read -- CVD, a --.

Column 16,
Line 49, "Isolates" should read -- isolates --.

Column 17,
Line 5, "Is" should read -- is --;
Line 62, "numeral 1013a" should read -- numeral 1013 a --; and "module" should read -- module. --.

UNITED STATES PATENT AND TRADEMARK OFFICE
CERTIFICATE OF CORRECTION

PATENT NO.     : 6,307,144 B1
DATED          : October 23, 2001
INVENTOR(S)    : Toshihiko Miura et al.

It is certified that error appears in the above-identified patent and that said Letters Patent is hereby corrected as shown below:

Column 18,
Line 15, "is" should be deleted;
Line 16, "occurred" should read -- occurs --;
Line 55, "is occurred" should read -- occurs --; and
Line 64, "intends" should read -- tends --.

Column 19,
Line 20, "11(B)" should read -- 11(B). --; and
Line 63, "back" should read -- back --.

Column 20,
Lines 14 and 45, "intends" should read -- tends --;
Line 32, "FIG. 12(A)" should read -- FIG. 12(A), --; and Column 21,
Line 14, "there by" should read -- thereby --; and
Line 52, "not," should read -- nut, --.

Column 22,
Line 16, "is" should be deleted; and
Line 63, " roof-Integral" should read -- roof-integral --.

Column 23,
Line 35, "suffered" should read -- suffering --.

Column 24,
Line 60, "therein," should read -- therein; --.

Signed and Sealed this

Second Day of April, 2002

*Attest:*

*Attesting Officer*

JAMES E. ROGAN
*Director of the United States Patent and Trademark Office*